US009502351B1

(12) United States Patent
Sahu

(10) Patent No.: US 9,502,351 B1
(45) Date of Patent: Nov. 22, 2016

(54) MULTIPLE SPLIT RAIL STANDARD CELL LIBRARY ARCHITECTURE

(71) Applicant: QUALCOMM Incorporated, San Diego, CA (US)

(72) Inventor: Satyanarayana Sahu, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/855,240

(22) Filed: Sep. 15, 2015

(51) Int. Cl.
*H01L 23/528* (2006.01)
*H01L 23/535* (2006.01)
*H01L 27/092* (2006.01)

(52) U.S. Cl.
CPC ......... *H01L 23/5286* (2013.01); *H01L 23/535* (2013.01); *H01L 27/092* (2013.01)

(58) Field of Classification Search
CPC H01L 23/5286; H01L 23/535; H01L 27/092
See application file for complete search history.

(56) References Cited

U.S. PATENT DOCUMENTS

| 8,063,415 | B2 | 11/2011 | Tsuda |
| 8,431,968 | B2 * | 4/2013 | Lu ................ G06F 17/5036 257/202 |
| 8,595,661 | B2 | 11/2013 | Kawa et al. |
| 8,742,464 | B2 | 6/2014 | Sherlekar et al. |
| 8,987,786 | B1 | 3/2015 | Tan et al. |
| 2013/0228877 | A1 | 9/2013 | Sugimoto et al. |

* cited by examiner

*Primary Examiner* — Jeffrey Zweizig
(74) *Attorney, Agent, or Firm* — Arent Fox LLP

(57) ABSTRACT

A MOS device includes first and second sets of power rails. The first set of power rails extends across the MOS device and includes at least two power rails for providing a first voltage to the MOS device. The first set of power rails is interior to an edge of a cell boundary in the MOS device. At least one power rail of the first set of power rails extends over a pMOS active region of the MOS device. The second set of power rails extends across the MOS device and includes at least two power rails for providing a second voltage to the MOS device. The second set of power rails is interior to an edge of the cell boundary in the MOS device. At least one power rail of the second set of power rails extends over an nMOS active region of the MOS device.

30 Claims, 10 Drawing Sheets

Mask 1
Mask 2 first direction →
second direction ↓

Mask 1
Mask 2 first direction
second direction

MULTIPLE SPLIT RAIL STANDARD CELL LIBRARY ARCHITECTURE

BACKGROUND

Field

The present disclosure relates generally to layout construction, and more particularly, to a multiple split rail ultra-high performance standard cell library architecture.

Background

A standard cell is an integrated circuit that may be implemented with digital logic. An application-specific integrated circuit (ASIC), such as a system-on-a-chip (SoC) device, may contain thousands to millions of standard cells. Reducing a size/area footprint of ASICs is beneficial. Reducing a size of the process technology may allow for the size/area footprint of ASICs to be reduced. Standard power rail designs may be unavailable or insufficient for certain smaller process technologies (e.g., 10 nm). Accordingly, there is a need for new power rail designs, such as for example, when standard power rail designs are unavailable or insufficient.

SUMMARY

In aspects of the disclosure provide, exemplary multiple split power rail standard cell library architectures are provided. The exemplary multiple split power rail standard cell library architectures may be utilized when shared power rails are unavailable or are available in widths that are insufficient to support IR-drop/EM requirements.

In an aspect of the disclosure, a metal oxide semiconductor (MOS) device includes a first set of power rails and a second set of power rails. The first set of power rails extends in a first direction across the MOS device. The first set of power rails includes at least two power rails for providing a first voltage to the MOS device. The first set of power rails is interior to an edge of a cell boundary in the MOS device with respect to a second direction orthogonal to the first direction. At least one power rail of the first set of power rails extends over a p-type MOS (pMOS) active region of the MOS device. The second set of power rails extends in the first direction across the MOS device. The second set of power rails includes at least two power rails for providing a second voltage to the MOS device. The second voltage is different than the first voltage. The second set of power rails is interior to an edge of a cell boundary in the MOS device with respect to the second direction. At least one power rail of the second set of power rails extends over an n-type MOS (nMOS) active region of the MOS device.

In an aspect of the disclosure, a MOS device operates by propagating a first voltage in a first set of power rails extending in a first direction across the MOS device. The first set of power rails includes at least two power rails for providing the first voltage to the MOS device. The first set of power rails is interior to an edge of a cell boundary in the MOS device with respect to a second direction orthogonal to the first direction. At least one power rail of the first set of power rails extends over a pMOS active region of the MOS device. In addition, the MOS device operates by propagating a second voltage in a second set of power rails extending in the first direction across the MOS device. The second set of power rails includes at least two power rails for providing the second voltage to the MOS device. The second voltage is different than the first voltage. The second set of power rails is interior to an edge of the cell boundary in the MOS device with respect to the second direction. At least one power rail of the second set of power rails extends over an nMOS active region of the MOS device.

In an aspect of the disclosure, a MOS device includes means for propagating a first voltage in a first set of power rails extending in a first direction across the MOS device. The first set of power rails includes at least two power rails for providing the first voltage to the MOS device. The first set of power rails is interior to an edge of a cell boundary in the MOS device with respect to a second direction orthogonal to the first direction. At least one power rail of the first set of power rails extends over a pMOS active region of the MOS device. In addition, the MOS device includes means for propagating a second voltage in a second set of power rails extending in the first direction across the MOS device. The second set of power rails includes at least two power rails for providing the second voltage to the MOS device. The second voltage is different than the first voltage. The second set of power rails is interior to an edge of the cell boundary in the MOS device with respect to the second direction. At least one power rail of the second set of power rails extends over an nMOS active region of the MOS device.

In an aspect of the disclosure, a computer-readable medium includes design data corresponding to an apparatus. The apparatus includes a first set of power rails extending in a first direction across the MOS device. The first set of power rails includes at least two power rails for providing a first voltage to the MOS device. The first set of power rails is interior to an edge of a cell boundary in the MOS device with respect to a second direction orthogonal to the first direction. At least one power rail of the first set of power rails extends over a pMOS active region of the MOS device. The apparatus further includes a second set of power rails extending in the first direction across the MOS device. The second set of power rails includes at least two power rails for providing a second voltage to the MOS device. The second voltage is different than the first voltage. The second set of power rails is interior to an edge of the cell boundary in the MOS device with respect to the second direction. At least one power rail of the second set of power rails extends over an nMOS active region of the MOS device.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

As discussed supra, a standard cell is an integrated circuit that may be implemented with digital logic. An ASIC, such as an SoC device, may contain thousands to millions of standard cells. Reducing a size/area footprint of ASICs is beneficial. Reducing a size of the process technology may allow for the size/area footprint of ASICs to be reduced. Standard power rail designs may be unavailable or insufficient for certain process technologies (e.g., 10 nm process technology). Fabrication of the 10 nm process technology is complex, and due to the complexity, a set number of standard cell library architectures may be predefined. For example, a first standard cell library architecture with a 360-380 nm cell height and three pMOS/nMOS fins (fin field effect transistor (finFET) technology) in the pMOS/nMOS active regions may have a 105-110 nm wide shared M1 power rail. For another example, a second standard cell library architecture with a 420-440 nm cell height and four pMOS/nMOS fins in the pMOS/nMOS active regions may also have a 105-110 nm wide shared M1 power rail. Special marking layers may be used for the aforementioned first and second standard cell library architectures with a construct layer to define the 105-110 nm power rails. The fin pitch need not be maintained under the construct layer/power rail. Any other designs without the special marking layers may need a regular fin pitch. An ultra-high performance (UHP) standard cell library may need a large transistor size and a cell height taller than 420-440 nm to accommodate non-default routes for highly sensitive signals.

Figure 1:
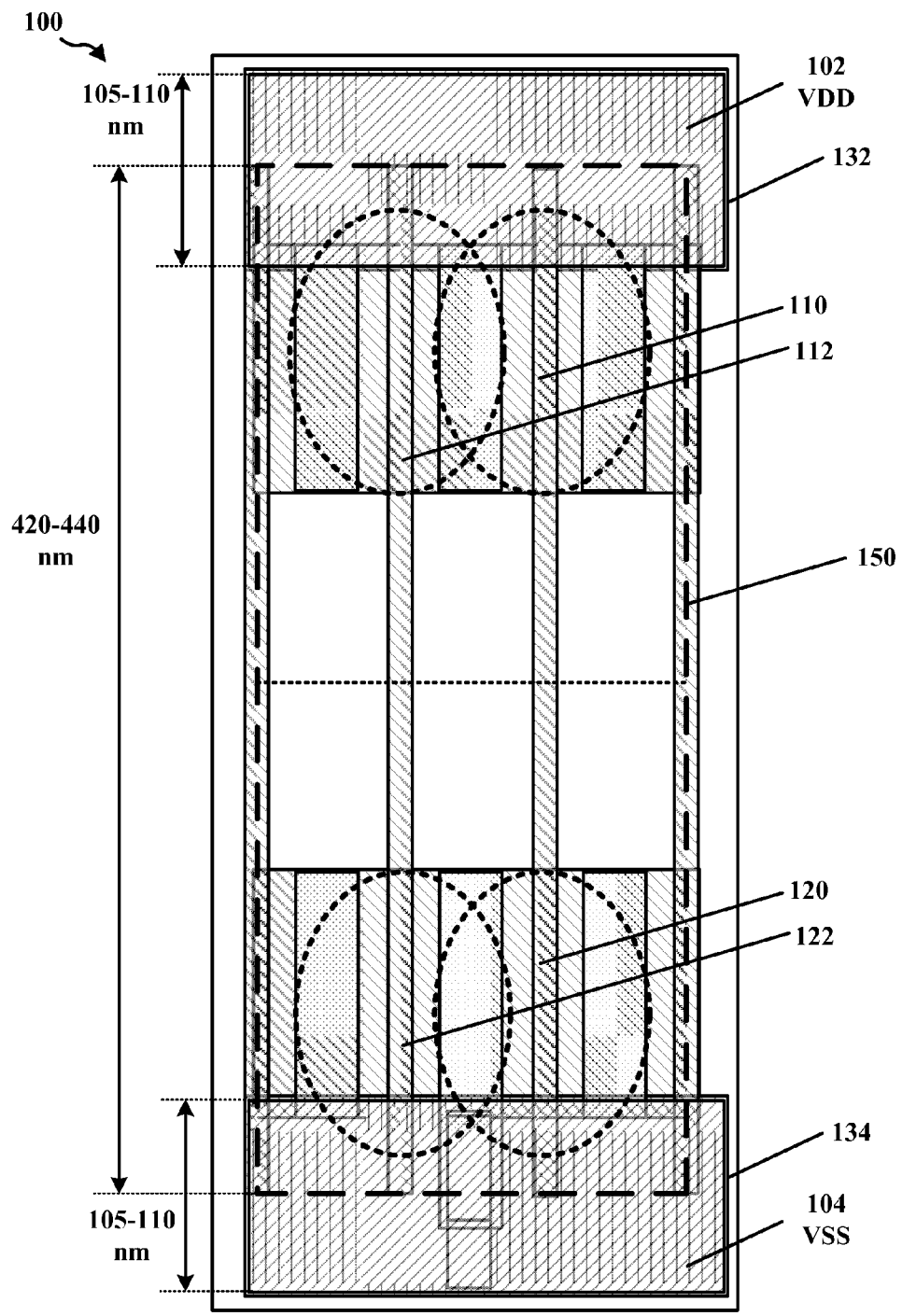
FIG. 1 is a diagram illustrating a layout construction with a 105-110 nm metal one (M1) layer shared power rail.

FIG. 1 is a diagram 100 illustrating a layout construction with a 105-110 nm M1 layer shared power rail. The cell height is 420-440 nm. The layout construction includes a shared pMOS power rail 102 for providing VDD to pMOS transistors 110 and 112, and includes a shared nMOS power rail 104 for providing VSS to nMOS transistors 120 and 122. The power rails 102, 104 extend in a first (horizontal) direction, orthogonal to the second (vertical) direction. The power rail 102 is shared between the illustrated cell identified by the dotted line 150, and a cell located adjacent the cell 150 (in the second direction) at a top edge of the cell 150. The power rail 102 may also be shared with cells adjacent the cell 150, as the power rail 102 may extend in the first direction across multiple cells. The power rail 104 is shared between the cell 150, and a cell located adjacent the cell 150 (in the second direction) at a bottom edge of the cell 150. The power rail 104 may also be shared with cells adjacent the cell 150, as the power rail 104 may extend in the first direction across multiple cells. The shared power rails 102, 104 may be defined with a construct layer 132, 134, respectively, and may therefore be 105-110 nm in width. The power rail width is in the second direction.

A predefined 105-110 nm M1 shared power rail may not be used for a 574 nm height standard cell library architecture because of design rules restrictions, as the construct layer may not be used with a 574 nm height standard cell library architecture. Without the construct layer, the fin pitch under the M1 shared power rail must be consistent with the fin pitch in other portions of the MOS device. Maintaining the fin pitch under the M1 shared power rail causes further limitations in available widths for the M1 shared power rails. In a 574 nm height standard cell library architecture, a 60 nm shared M1 power rail may be used without the construct layer, as provided infra in FIG. 2.

Figure 2:
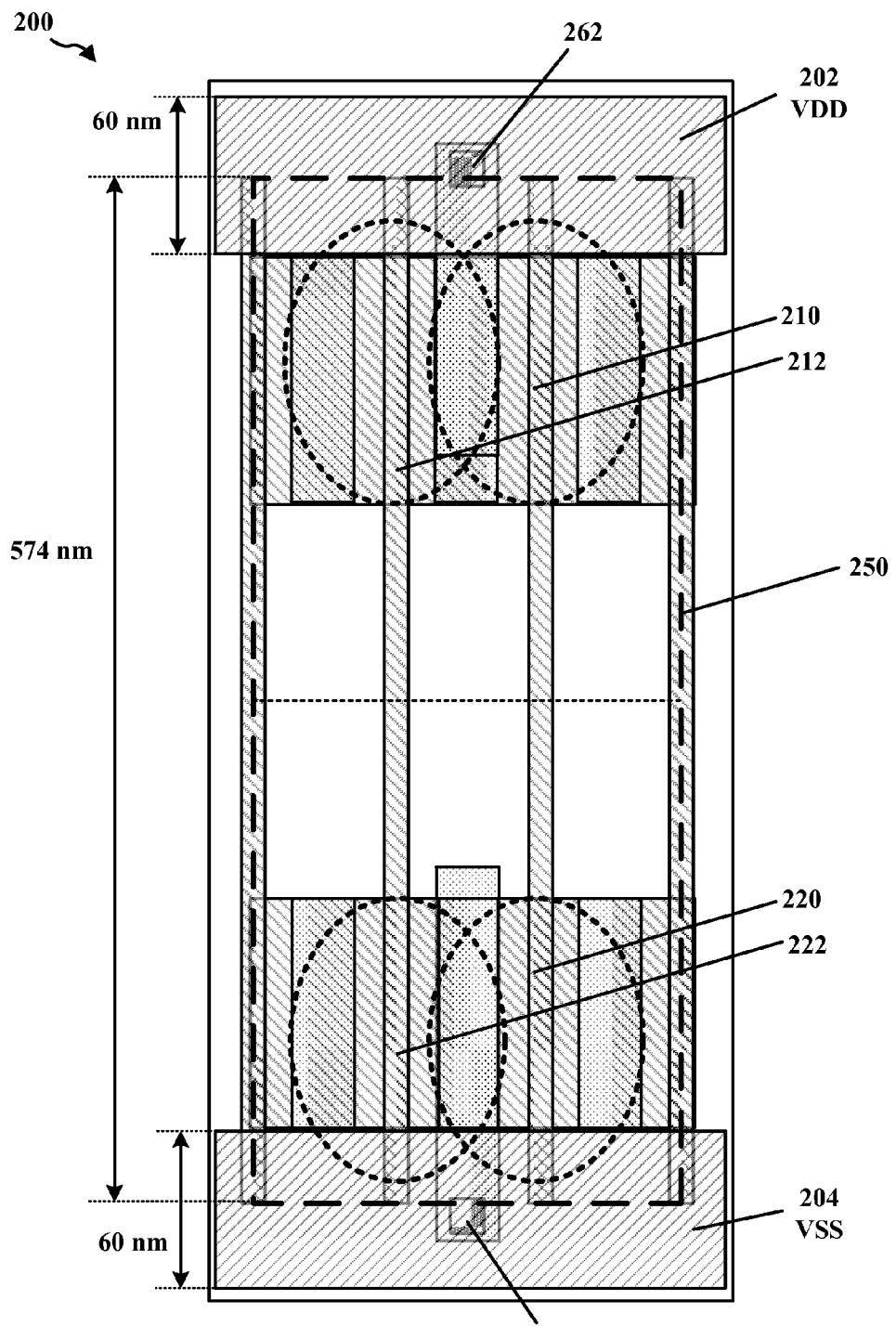
FIG. 2 is a diagram illustrating a layout construction with a 60 nm M1 layer shared power rail.

FIG. 2 is a diagram illustrating a layout construction with a 60 nm M1 layer shared power rail. The cell height is 574 nm. The layout construction includes a shared pMOS power rail 202 for providing VDD to pMOS transistors 210 and 212, and includes a shared nMOS power rail 204 for providing VSS to nMOS transistors 220 and 222. The power rails 202, 204 extend in a first (horizontal) direction, orthogonal to the second (vertical) direction. The power rail 202 is shared between the illustrated cell identified by the dotted line 250, and a cell located adjacent the cell 250 (in the second direction) at a top edge of the cell 250. The power rail 202 may also be shared with cells adjacent the cell 250, as the power rail 202 may extend in the first direction across multiple cells. The power rail 204 is shared between the cell 250, and a cell located adjacent the cell 250 (in the second direction) at a bottom edge of the cell 250. The power rail 204 may also be shared with cells adjacent the cell 250, as the power rail 204 may extend in the first direction across multiple cells. The shared power rails 202, 204 may be 60 nm in width without defining a construct layer. The power rail width is in the second direction. The power rail 202 may couple to a source of the transistors 210, 212 through a via (V0) 262. The power rail 204 may couple to a source of the transistors 220, 222 through a via (V0) 264.

The 60 nm shared M1 power rail may be used without defining a construct layer, but has several disadvantages. First, the 60 nm shared M1 power rail may be inadequate to support desired IR-drop/electromigration (EM) characteristics for high frequency designs. That is, the performance/reliability of the 60 nm shared M1 power rail may be insufficient due to the IR-drop (i.e., voltage drop) across the 60 nm shared M1 power rail being too large, and/or EM causing too much degradation of the 60 nm shared M1 power rail. Second, only square vias 262, 264 may be used for the power rails 202, 204, respectively. The square vias 262, 264 may have insufficient performance and reliability due to IR-drop/EM. Further, a single square via (e.g., 262 or 264) may be shared for two cells when two cells are abutted, causing additional performance and reliability issues with the single square via.

The performance and reliability issues of the standard cell library architecture with shared M1 power rails may be alleviated to some extent through the use of 80 nm shared M1 power rails. The 80 nm shared M1 power rails have a 33% greater width than the 60 nm shared M1 power rails, and therefore suffer less from the effects of IR-drop/EM. However, 80 nm shared M1 power rails must have a large spacing to a neighboring M1 interconnect within the cell 250. Such a large spacing between the 80 nm shared M1 power rail and a neighboring M1 interconnect within the cell 250 reduces the internal routing availability. If metal two (M2) layer interconnects extend in the first direction, an M2 layer shunt may be used with a narrower (smaller width) power rail to improve IR-drop/EM. However, when M2 layer interconnects in the standard cell library architecture extend only in the second direction (i.e., do not extend parallel to the M1 power rails, but rather, extend orthogonal to the M1 power rails), an M2 layer shunt may not be used with a narrower power rail to improve IR-drop/EM.

Accordingly, as a predefined 105-110 nm M1 shared power rail may not be used with a 574 nm height standard cell library architecture, and 60 nm/80 nm height M1 shared power rails provide insufficient performance, reliability, and routability, there is currently a need for new power rail designs. Such designs are provided infra with respect to FIGS. 3-9.

Figure 3:
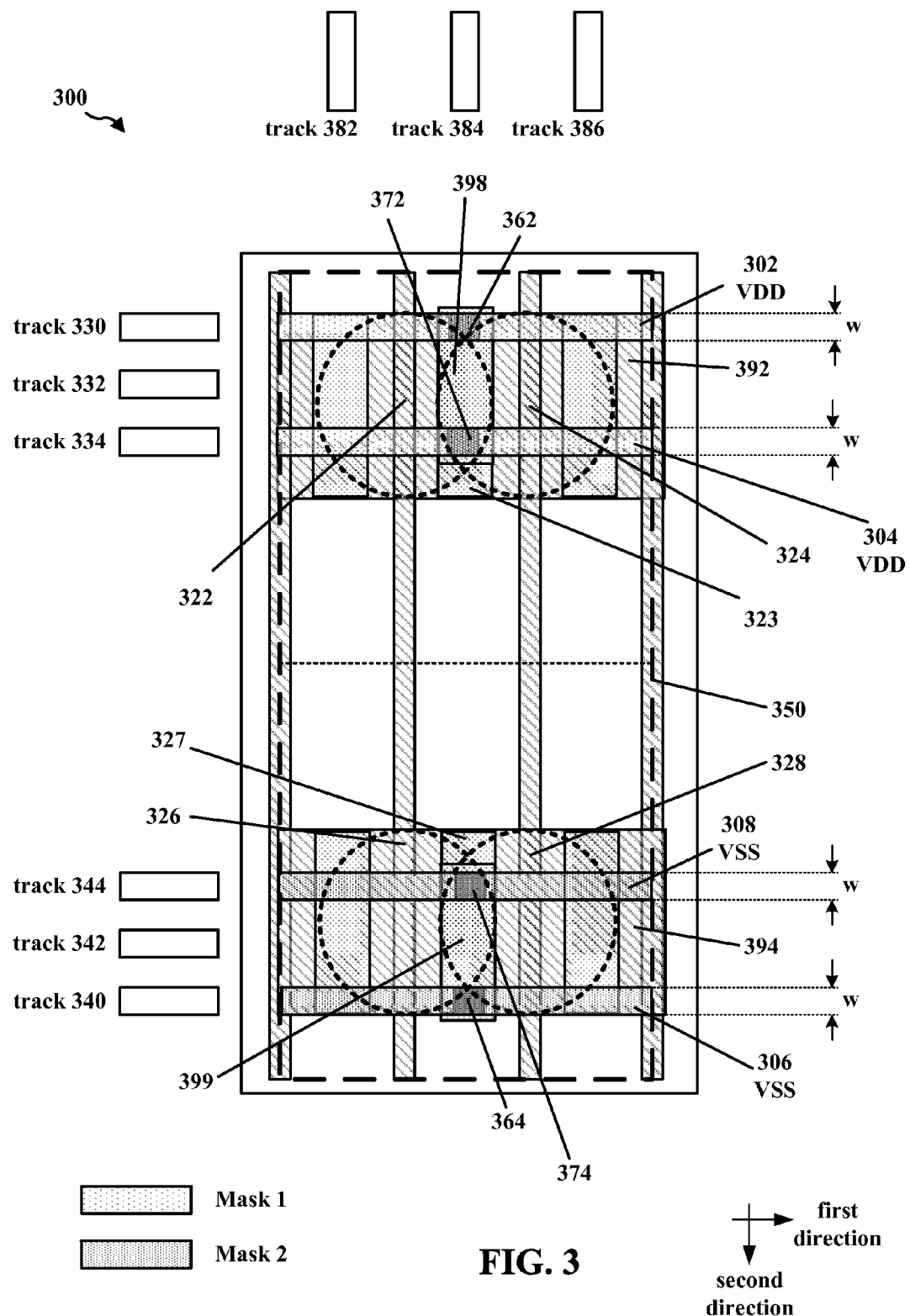
FIG. 3 is a diagram illustrating a first exemplary layout construction.

FIG. 3 is a diagram 300 illustrating a first exemplary layout construction. As shown in FIG. 3, a MOS device includes a first set of power rails 302 and 304, and includes a second set of power rails 306 and 308. The first set of power rails 302, 304 extends across the MOS device in the first (horizontal) direction. The first set of power rails 302, 304 includes two power rails 302 and 304 for providing a first voltage VDD to the MOS device. The two power rails 302 and 304 provide the first voltage VDD to a source 323 of pMOS transistors 322 and 324 of the MOS device. While the diagram 300 of FIG. 3 illustrates two pMOS transistors 322, 324, the MOS device may include two or more pMOS transistors. The first set of power rails 302, 304 is interior to an edge of a cell boundary 350 in the MOS device with respect to the second direction orthogonal to the first direction. That is, the first set of power rails 302, 304 do not include a shared power rail that is shared by an adjacent cell at a top edge of the cell 350 (i.e., in the second direction from the first set of power rails). Each of the power rails of the first set of power rails 302, 304 extends over a pMOS active region 392 of the MOS device. The second set of power rails 306, 308 extends across the MOS device in the first (horizontal) direction. The second set of power rails 306, 308 includes two power rails 306 and 308 for providing a second voltage VSS (e.g., ground) to the MOS device. The second voltage VSS is different than the first voltage VDD. Specifically, the second voltage VSS is less than the first voltage VDD. The two power rails 306 and 308 provide the second voltage VSS to a source 327 of nMOS transistors 326 and 328 of the MOS device. While the diagram 300 of FIG. 3 illustrates two nMOS transistors 326, 328, the MOS device may include two or more nMOS transistors. The second set of power rails 306, 308 is interior to an edge of a cell boundary 350 in the MOS device with respect to the second direction orthogonal to the first direction. That is, the second set of power rails 306, 308 do not include a shared power rail that is shared by an adjacent cell at a bottom edge of the cell 350 (i.e., in the second direction from the second set of power rails). Each of the power rails of the second set of power rails 306, 308 extends over an nMOS active region 394 of the MOS device.

As shown in FIG. 3, the first and second sets of power rails 302, 304, 306, 308 are unidirectional, as they extend in the first direction only. The first set of power rails 302, 304 are connected together at the source 323 of the pMOS transistors 322, 324. The second set of power rails 306, 308 are connected together at the source 327 of the nMOS transistors 326, 328. As such, the first set of power rails 302, 304 are connected to the same pMOS transistor source 323 in the pMOS active region 392, and the second set of power rails 306, 308 are connected to the same nMOS transistor source 327 in the nMOS active region 394. This configuration is unlike engineering change order (ECO) cells and power management cells in which pairs of power rails may be connected together through a switch/transistor, with one of the power rails connected to a source of a transistor and another of the power rails connected to a drain of the transistor. In one configuration, the first and second sets of power rails 302, 304, 306, 308 may be on an M1 layer. The pMOS active region 392 includes pMOS transistors 322, 324 with a pMOS transistor source 323. A via 362 is coupled between the power rail 302 and the pMOS transistor source 323. A via 372 is coupled between the power rail 304 and the pMOS transistor source 323. The vias 362, 372 are coupled to the pMOS transistor source 323 through a metal diffusion (MD) layer interconnect 398 contacting the pMOS transistor source 323. The vias 362, 372 are aligned along the second direction orthogonal to the first direction. The nMOS active region 394 includes nMOS transistors 326, 328 with an nMOS transistor source 327. A via 364 is coupled between the power rail 306 and the nMOS transistor source 327. A via 374 is coupled between the power rail 308 and the nMOS transistor source 327. The vias 364, 374 are coupled to the nMOS transistor source 327 through an MD layer interconnect 399 contacting the nMOS transistor source 327. The vias 364, 374 are aligned along the second direction orthogonal to the first direction.

As shown in FIG. 3, the vias 362, 372 are aligned along track 384 of available tracks 382, 384, and 386 extending in the second direction. In addition, the vias 364, 374 are aligned along track 384 of available tracks 382, 384, 386. However, generally, the vias 362, 372 may align along a first track 382, 384, or 386 extending in the second direction, and the vias 364, 374 may align along a second track 382, 384, or 386 extending in the second direction. Specifically, the vias 362, 372 may align along the track corresponding to a source of at least one of the pMOS transistors 322, 324, and the vias 364, 374 may align along the track corresponding to a source of at least one of the nMOS transistors 326, 328.

As shown in FIG. 3, the power rail 302 extends along the track 330 in the first direction and the power rail 304 extends along the track 334 in the first direction. In addition, the power rail 306 extends along the track 340 in the first direction and the power rail 308 extends along the track 344 in the first direction. The tracks 330, 334 have one intervening track 332 between them. The tracks 340, 344 have one intervening track 342 between them. The tracks 330, 332, 334, 340, 342, 344, 382, 384, 386 correspond to locations where interconnects, power rails, and vias may be routed/located.

Each of the power rails of the first and second sets of power rails 302, 304, 306, 308 may have approximately the same width w (e.g., 24 nm). In one configuration, M1 interconnects that are not power rails and that extend on tracks between tracks 334 and 344 may have a different width (e.g., 22 nm) than the width of the first and second sets of power rails 302, 304, 306, 308. Further, M1 interconnects that are not power rails and that extend on tracks 332 and/or 342 may have the same width (e.g., 24 nm) as the first and second sets of power rails 302, 304, 306, 308.

Power rails in every other track may be formed by the same mask. As there is just one intervening track 332 between the first set of power rails 302, 304 on tracks 330, 334, and just one intervening track 342 between the second set of power rails 306, 308 on tracks 340, 344, the first set of power rails 302, 304 may be formed by the same mask, and the second set of power rails 306, 308 may be formed by the same mask. If there are an even number of intervening tracks between the power rail 304 and the power rail 308, the power rails 304 and 308 may be formed by different masks.

As such, the power rails 302, 304 may be formed by a different mask than the power rails 306, 308. However, if there are an odd number of intervening tracks between the power rail 304 and the power rail 308, the power rails 304 and 308 may be formed by the same mask. As such, the power rails 302, 304, 306, 308 may all be formed by the same mask. In one configuration, the MOS device includes an even number of tracks between the power rails 304, 308. In such a configuration, as shown in FIG. 3, the first set of power rails 302, 304 are formed by a first mask, and the second set of power rails 306, 308 are formed by a second mask different than the first mask. Balancing the formation of the power rails across different masks may improve manufacturing yield in relation to the power rails.

Figure 4:
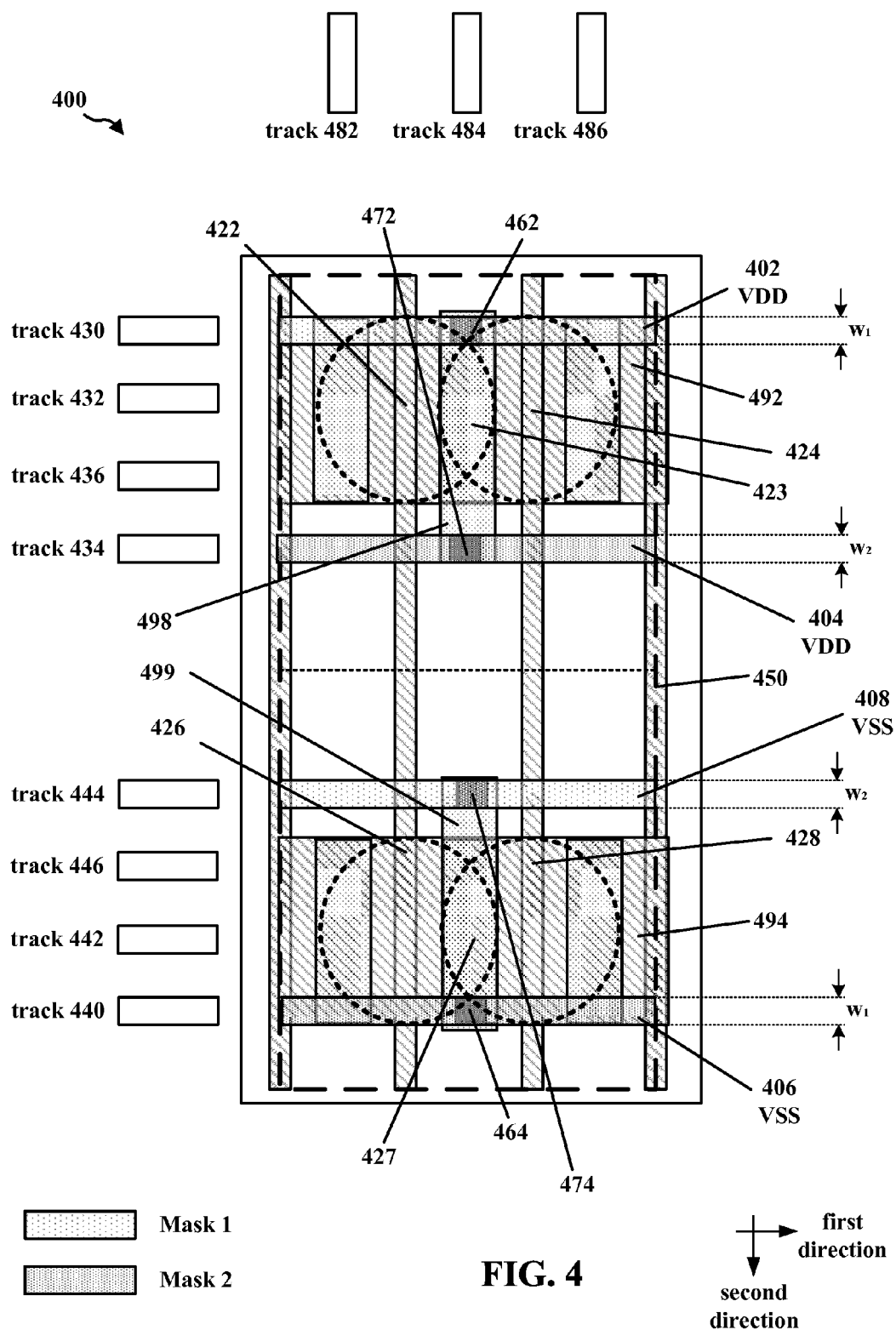
FIG. 4 is a diagram illustrating a second exemplary layout construction.

FIG. 4 is a diagram 400 illustrating a second exemplary layout construction. As shown in FIG. 4, a MOS device includes a first set of power rails 402 and 404, and includes a second set of power rails 406 and 408. The first set of power rails 402, 404 extends across the MOS device in the first (horizontal) direction. The first set of power rails 402, 404 includes two power rails 402 and 404 for providing a first voltage VDD to the MOS device. The two power rails 402 and 404 provide the first voltage VDD to a source 423 of pMOS transistors 422 and 424 of the MOS device. While the diagram 400 of FIG. 4 illustrates two pMOS transistors 422, 424, the MOS device may include two or more pMOS transistors. The first set of power rails 402, 404 is interior to an edge of a cell boundary 450 in the MOS device with respect to the second direction orthogonal to the first direction. That is, the first set of power rails 402, 404 do not include a shared power rail that is shared by an adjacent cell at a top edge of the cell 450 (i.e., in the second direction from the first set of power rails). Only the power rail 402 of the first set of power rails 402, 404 extends over a pMOS active region 492 of the MOS device. The power rail 404 of the first set of power rails 402, 404 does not extend over the pMOS active region 492 of the MOS device. The second set of power rails 406, 408 extends across the MOS device in the first (horizontal) direction. The second set of power rails 406, 408 includes two power rails 406 and 408 for providing a second voltage VSS (e.g., ground) to the MOS device. The second voltage VSS is different than the first voltage VDD. Specifically, the second voltage VSS is less than the first voltage VDD. The two power rails 406 and 408 provide the second voltage VSS to a source of nMOS transistors 426 and 428 of the MOS device. While the diagram 400 of FIG. 4 illustrates two nMOS transistors 426, 428, the MOS device may include two or more nMOS transistors. The second set of power rails 406, 408 is interior to an edge of a cell boundary 450 in the MOS device with respect to the second direction orthogonal to the first direction. That is, the second set of power rails 406, 408 do not include a shared power rail that is shared by an adjacent cell at a bottom edge of the cell 450 (i.e., in the second direction from the second set of power rails). Only the power rail 406 of the second set of power rails 406, 408 extends over an nMOS active region 494 of the MOS device. The power rail 408 of the second set of power rails 406, 408 does not extend over the nMOS active region 494 of the MOS device.

As shown in FIG. 4, the first and second sets of power rails 402, 404, 406, 408 are unidirectional, as they extend in the first direction only. The first set of power rails 402, 404 are connected together at the source 423 of the pMOS transistors 422, 424. The second set of power rails 406, 408 are connected together at the source 427 of the nMOS transistors 426, 428. As such, the first set of power rails 402, 404 are connected to the same pMOS transistor source 423 in the pMOS active region 492, and the second set of power rails 406, 408 are connected to the same nMOS transistor source 427 in the nMOS active region 494. As discussed supra, this configuration is unlike ECO cells and power management cells in which pairs of power rails may be connected together through a switch/transistor, with one of the power rails connected to a source of a transistor and another of the power rails connected to a drain of the transistor. In one configuration, the first and second sets of power rails 402, 404, 406, 408 may be on an M1 layer. The pMOS active region 492 includes pMOS transistors 422, 424 with a pMOS transistor source 423. A via 462 is coupled between the power rail 402 and the pMOS transistor source 423. A via 472 is coupled between the power rail 404 and the pMOS transistor source 423. The vias 462, 472 are coupled to the pMOS transistor source 423 through an MD layer interconnect 498 contacting the pMOS transistor source 423. The vias 462, 472 are aligned along the second direction orthogonal to the first direction. The nMOS active region 494 includes nMOS transistors 426, 428 with an nMOS transistor source 427. A via 464 is coupled between the power rail 406 and the nMOS transistor source 427. A via 474 is coupled between the power rail 408 and the nMOS transistor source 427. The vias 464, 474 are coupled to the nMOS transistor source 427 through an MD layer interconnect 499 contacting the nMOS transistor source 427. The vias 464, 474 are aligned along the second direction orthogonal to the first direction.

As shown in FIG. 4, the vias 462, 472 are aligned along track 484 of available tracks 482, 484, and 486 extending in the second direction. In addition, the vias 464, 474 are aligned along track 484 of available tracks 482, 484, 486. However, generally, the vias 462, 472 may align along a first track 482, 484, or 486 extending in the second direction, and the vias 464, 474 may align along a second track 482, 484, or 486 extending in the second direction. Specifically, the vias 462, 472 may align along the track corresponding to a source of at least one of the pMOS transistors 422, 424, and the vias 464, 474 may align along the track corresponding to a source of at least one of the nMOS transistors 426, 428.

As shown in FIG. 4, the power rail 402 extends along a track 430 in the first direction and the power rail 404 extends along a track 434 in the first direction. In addition, the power rail 406 extends along a track 440 in the first direction and the power rail 408 extends along a track 444 in the first direction. The tracks 430, 434 are illustrated with two intervening tracks 432, 436 between them, but the tracks 430, 434 may have more than two intervening tracks. The tracks 440, 444 are illustrated with two intervening tracks 442, 446 between them, but the tracks 440, 444 may have more than two intervening tracks. The tracks 430, 432, 434, 436, 440, 442, 444, 446, 482, 484, 486 correspond to locations where interconnects, power rails, and vias may be routed/located.

The power rails 402, 406 may have a width $w_1$, and the power rails 404, 408 may have a width $w_2$ different than the width $w_1$. In one configuration, the width $w_2$ is less than the width $w_1$. For example, the width $w_1$ may be 24 nm and the width $w_2$ may be 22 nm. In one configuration, M1 interconnects that are not power rails and that extend on tracks between tracks 434 and 444 may have the same width (e.g., 22 nm) as the width of the power rails 404, 408. Further, M1 interconnects that are not power rails and that extend on tracks 432, 436, 442, and/or 446 may have the same width (e.g., 24 nm) as the power rails 402, 406.

Power rails in every other track may be formed by the same mask. Assuming there are an even number (e.g., two)

of intervening tracks between the first set of power rails 402, 404, and an even number (e.g., two) of intervening tracks between the second set of power rails 406, 408, the power rail 402 and the power rail 404 may be formed by different masks, and the power rail 406 and the power rail 408 may be formed by different masks. If there are an even number of intervening tracks between the power rail 404 and the power rail 408, the power rails 404 and 408 may be formed by different masks. As such, the power rails 402 and 408 may be formed by a first mask, and the power rails 404 and 406 may be formed by a second mask different than the first mask. However, if there are an odd number of intervening tracks between the power rail 404 and the power rail 408, the power rails 404 and 408 may be formed by the same mask. As such, the power rails 404 and 408 may be formed by a first mask, and the power rails 402 and 406 may be formed by a second mask different than the first mask.

If there are an odd number (e.g., three or more) of intervening tracks between the first set of power rails 402, 404, and an odd number (e.g., three or more) of intervening tracks between the second set of power rails 406, 408, the power rail 402 and the power rail 404 may be formed by the same mask, and the power rail 406 and the power rail 408 may be formed by the same mask. If there are an even number of intervening tracks between the power rail 404 and the power rail 408, the power rails 404 and 408 may be formed by different masks. As such, the power rails 402, 404 may be formed by a different mask than the power rails 406, 408. However, if there are an odd number of intervening tracks between the power rail 404 and the power rail 408, the power rails 404 and 408 may be formed by the same mask. As such, the power rails 402, 404, 406, 408 may all be formed by the same mask. As illustrated in FIG. 4, the power rails 402, 408 are formed by a first mask (indicated in FIG. 4 as Mask 1), and the power rails 404, 406 are formed by a second mask different than the first mask (indicated in FIG. 4 as Mask 2).

Figure 5:
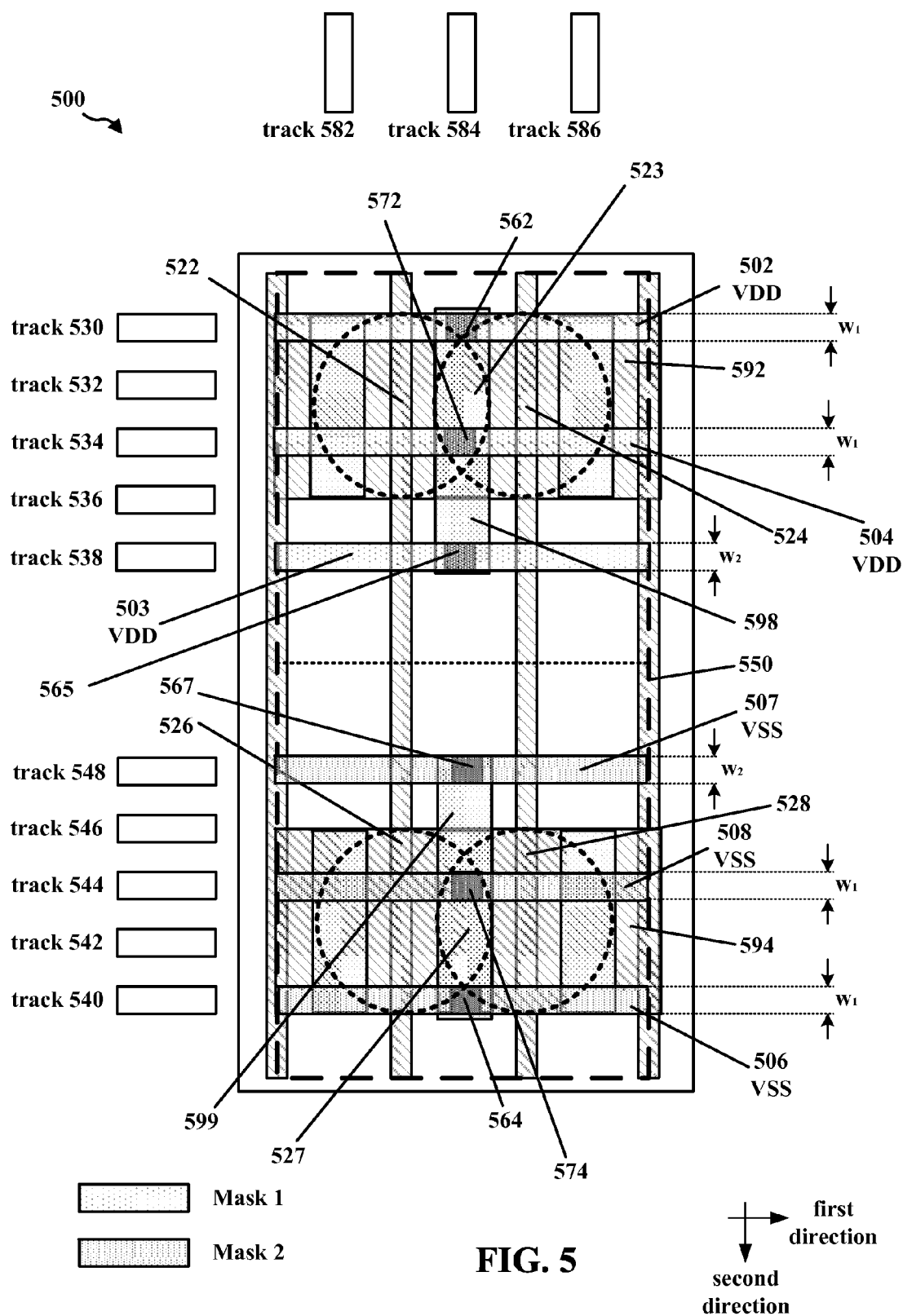
FIG. 5 is a diagram illustrating a third exemplary layout construction.

FIG. 5 is a diagram 500 illustrating a third exemplary layout construction. As shown in FIG. 5, a MOS device includes a first set of power rails 502, 503, and 504, and includes a second set of power rails 506, 507, and 508. The first set of power rails 502, 503, 504 extends across the MOS device in the first (horizontal) direction. The first set of power rails 502, 503, 504 includes three power rails 502, 503, and 504 for providing a first voltage VDD to the MOS device. The three power rails 502, 503, 504 provide the first voltage VDD to a source 523 of pMOS transistors 522 and 524 of the MOS device. While the diagram 500 of FIG. 5 illustrates two pMOS transistors 522, 524, the MOS device may include two or more pMOS transistors. The first set of power rails 502, 503, 504 is interior to an edge of a cell boundary 550 in the MOS device with respect to the second direction orthogonal to the first direction. That is, the first set of power rails 502, 503, 504 do not include a shared power rail that is shared by an adjacent cell at a top edge of the cell 550 (i.e., in the second direction from the first set of power rails). Two of the power rails 502, 504 of the first set of power rails 502, 503, 504 extend over a pMOS active region 592 of the MOS device. One power rail 503 of the first set of power rails 502, 503, 504 does not extend over the pMOS active region 592 of the MOS device. The second set of power rails 506, 507, 508 extends across the MOS device in the first (horizontal) direction. The second set of power rails 506, 507, 508 includes three power rails 506, 507, 508 for providing a second voltage VSS (e.g., ground) to the MOS device. The second voltage VSS is different than the first voltage VDD. Specifically, the second voltage VSS is less than the first voltage VDD. The three power rails 506, 507, 508 provide the second voltage VSS to a source 527 of nMOS transistors 526 and 528 of the MOS device. While the diagram 500 of FIG. 5 illustrates two nMOS transistors 526, 528, the MOS device may include two or more nMOS transistors. The second set of power rails 506, 507, 508 is interior to an edge of a cell boundary 550 in the MOS device with respect to the second direction orthogonal to the first direction. That is, the second set of power rails 506, 507, 508 do not include a shared power rail that is shared by an adjacent cell at a bottom edge of the cell 550 (i.e., in the second direction from the second set of power rails). Two of the power rails 506, 508 of the second set of power rails 506, 507, 508 extend over an nMOS active region 594 of the MOS device. One power rail 507 of the second set of power rails 506, 507, 508 does not extend over the nMOS active region 594 of the MOS device.

As shown in FIG. 5, the first and second sets of power rails 502, 503, 504, 506, 507, 508 are unidirectional, as they extend in the first direction only. The first set of power rails 502, 503, 504 is connected together at the source 523 of the pMOS transistors 522, 524. The second set of power rails 506, 507, 508 is connected together at the source 527 of the nMOS transistors 526, 528. As such, the first set of power rails 502, 503, 504 are connected to the same pMOS transistor source 523 in the pMOS active region 592, and the second set of power rails 506, 507, 508 are connected to the same nMOS transistor source 527 in the nMOS active region 594. As discussed supra, this configuration is unlike ECO cells and power management cells in which pairs of power rails may be connected together through a switch/transistor, with one of the power rails connected to a source of a transistor and another of the power rails connected to a drain of the transistor. In one configuration, the first and second sets of power rails 502, 503, 504, 506, 507, 508 may be on an M1 layer. The pMOS active region 592 includes pMOS transistors 522, 524 with a pMOS transistor source 523. A via 562 is coupled between the pMOS power rail 502 and the pMOS transistor source 523. A via 572 is coupled between the pMOS power rail 504 and the pMOS transistor source 523. A via 565 is coupled between the pMOS power rail 503 and the pMOS transistor source 523. The vias 562, 572, 565 are coupled to the pMOS transistor source 523 through an MD layer interconnect 598 contacting the pMOS transistor source 523. The vias 562, 564, 565 are aligned along the second direction orthogonal to the first direction. The nMOS active region 594 includes nMOS transistors 526, 528 with an nMOS transistor source 527. A via 564 is coupled between the nMOS power rail 506 and the nMOS transistor source 527. A via 574 is coupled between the nMOS power rail 508 and the nMOS transistor source 527. A via 567 is coupled between the nMOS power rail 507 and the nMOS transistor source 527. The vias 564, 574, 567 are coupled to the nMOS transistor source 527 through an MD layer interconnect 599 contacting the nMOS transistor source 527.

As shown in FIG. 5, the vias 562, 572, 565 are aligned along track 584 of available tracks 582, 584, and 586 extending in the second direction. In addition, the vias 564, 574, 567 are aligned along track 584 of available tracks 582, 584, 586. However, generally, the vias 562, 572, 565 may align along a first track 582, 584, or 586 extending in the second direction, and the vias 564, 574, 567 may align along a second track 582, 584, or 586 extending in the second direction. Specifically, the vias 562, 572, 565 may align along the track corresponding to a source of at least one of the pMOS transistors 522, 524, and the vias 564, 574, 567 may align along the track corresponding to a source of at least one of the nMOS transistors 526, 528.

As shown in FIG. 5, the first set of power rails 502, 504, 503 extends in the first direction along tracks 530, 534, 538, respectively. The second set of power rails 506, 508, 507 extends in the first direction along tracks 540, 544, 548, respectively. The tracks 530, 534, 538 have intervening tracks 532, 536 between them. The tracks 540, 544, 548 have intervening tracks 542, 546 between them. The tracks 530, 532, 534, 536, 538, 540, 542, 544, 546, 548, 582, 584, 586 correspond to locations where interconnects, power rails, and vias may be routed/located.

The power rails 502, 504, 506, 508 may have approximately the same width $w_1$, and the power rails 503, 507 may have approximately the same width $w_2$. In one configuration, the width $w_2$ is less than the width $w_1$. For example, the width $w_1$ may be 24 nm and the width $w_2$ may be 22 nm. In one configuration, M1 interconnects that are not power rails and that extend on tracks 536 or 546, or between tracks 538 and 548 may have the same width (e.g., 22 nm) as the width of the power rails 503, 507. Further, M1 interconnects that are not power rails and that extend on tracks 532 and/or 542 may have the same width (e.g., 24 nm) as the power rails 502, 504, 506, and 508.

Power rails in every other track may be formed by the same mask. Assuming there is an even number of tracks between the power rails 503 and 507, the power rails 503 and 507 may be formed by different masks. As shown in FIG. 5, the power rails 502, 504, 503 are formed by a first mask, and the power rails 506, 508, 507 are formed by a second mask different than the first mask.

Figure 6:
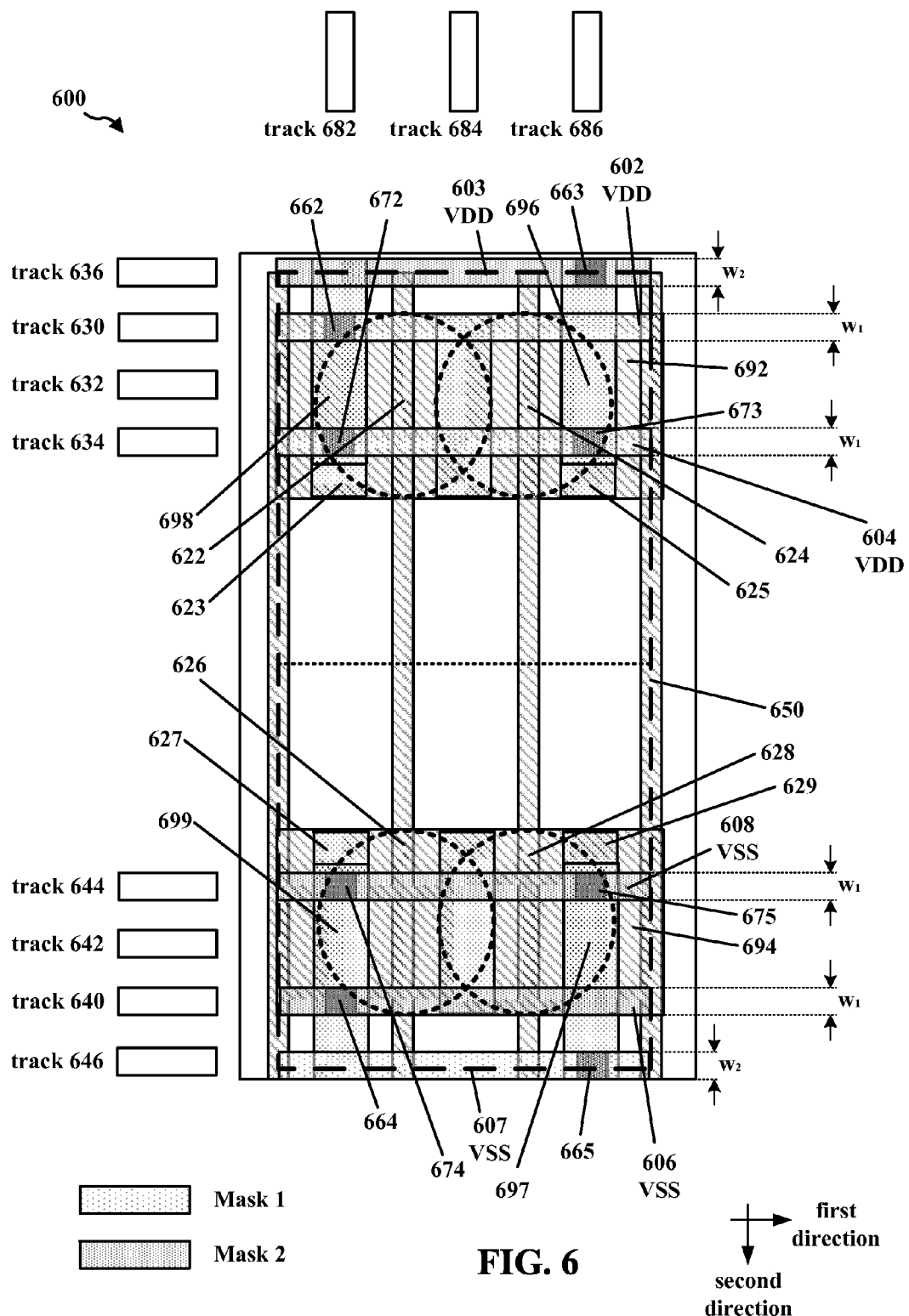
FIG. 6 is a diagram illustrating a fourth exemplary layout construction.

FIG. 6 is a diagram 600 illustrating a fourth exemplary layout construction. As shown in FIG. 6, a MOS device includes a first set of power rails 602 and 604, a second set of power rails 606 and 608, a shared pMOS power rail 603, and a shared nMOS power rail 607. The first set of power rails 602, 604 and the shared pMOS power rail 603 extend across the MOS device in the first (horizontal) direction. The first set of power rails 602, 604 includes two power rails 602 and 604 for providing a first voltage VDD to the MOS device. The shared pMOS power rail 603 also provides the first voltage VDD to the MOS device. The power rails 602, 603, 604 provide the first voltage VDD to sources 623 and 625 of pMOS transistors 622 and 624, respectively, of the MOS device. While the diagram 600 of FIG. 6 illustrates two pMOS transistors 622, 624, the MOS device may include two or more pMOS transistors. The first set of power rails 602, 604 is interior to an edge of a cell boundary 650 in the MOS device with respect to the second direction orthogonal to the first direction. That is, the first set of power rails 602, 604 do not include a shared power rail that is shared by an adjacent cell at a top edge of the cell 650 (i.e., in the second direction from the first set of power rails). The shared pMOS power rail 603 is on an edge of the cell boundary 650 in the MOS device, and is shared by an adjacent cell at a top edge of the cell 650. Each of the power rails of the first set of power rails 602, 604 extends over a pMOS active region 692 of the MOS device. The shared pMOS power rail 603 does not extend over the pMOS active region 692. The second set of power rails 606, 608 and the shared nMOS power rail 607 extend across the MOS device in the first (horizontal) direction. The second set of power rails 606, 608 includes two power rails 606 and 608 for providing a second voltage VSS (e.g., ground) to the MOS device. The shared nMOS power rail 607 also provides the second voltage VSS to the MOS device. The second voltage VSS is different than the first voltage VDD. Specifically, the second voltage VSS is less than the first voltage VDD. The power rails 606, 607, 608 provide the second voltage VSS to sources 627 and 629 of nMOS transistors 626 and 628, respectively, of the MOS device. While the diagram 600 of FIG. 6 illustrates two nMOS transistors 626, 628, the MOS device may include two or more nMOS transistors. The second set of power rails 606, 608 is interior to an edge of a cell boundary 650 in the MOS device with respect to the second direction orthogonal to the first direction. That is, the second set of power rails 606, 608 do not include a shared power rail that is shared by an adjacent cell at a bottom edge of the cell 650 (i.e., in the second direction from the second set of power rails). The shared nMOS power rail 607 is on an edge of the cell boundary 650 in the MOS device, and is shared by an adjacent cell at a bottom edge of the cell 650. Each of the power rails of the second set of power rails 606, 608 extends over an nMOS active region 694 of the MOS device. The shared nMOS power rail 607 does not extend over the nMOS active region 694.

As shown in FIG. 6, the power rails 602, 603, 604, 606, 607, 608 are unidirectional, as they extend in the first direction only. The power rails 602, 603, 604 are connected together at the sources 623 and 625 of the pMOS transistors 622 and 624, respectively. Specifically, the power rails 603 and 604 are connected together at the source 625 of the pMOS transistor 624, and the power rails 602 and 604 are connected together at the source 623 of the pMOS transistor 622. The power rails 606, 607, 608 are connected together at the sources 627 and 629 of the nMOS transistors 626 and 628, respectively. Specifically, the power rails 607 and 608 are connected together at the source 629 of the nMOS transistor 628, and the power rails 606 and 608 are connected together at the source 627 of the nMOS transistor 626. As such, the power rails 602, 604 are connected to the same pMOS transistor source 623 in the pMOS active region 692, the power rails 603, 604 are connected to the same pMOS transistor source 625 in the pMOS active region 692, the power rails 606, 608 are connected to the same nMOS transistor source 627 in the nMOS active region 694, and the power rails 607, 608 are connected to the same nMOS transistor source 629 in the nMOS active region 694. As discussed supra, this configuration is unlike ECO cells and power management cells in which pairs of power rails may be connected together through a switch/transistor, with one of the power rails connected to a source of a transistor and another of the power rails connected to a drain of the transistor. In one configuration, the power rails 602, 603, 604, 606, 607, 608 may be on an M1 layer. The pMOS active region 692 includes pMOS transistors 622 and 624 with pMOS transistor sources 623 and 625, respectively. A via 662 is coupled between the power rail 602 and the pMOS transistor source 623. A via 672 is coupled between the power rail 604 and the pMOS transistor source 623. A via 663 is coupled between the power rail 603 and the pMOS transistor source 625. A via 673 is coupled between the power rail 604 and the pMOS transistor source 625. The vias 662, 672 are coupled to the pMOS transistor source 623 through an MD layer interconnect 698 contacting the pMOS transistor source 623. The vias 663, 673 are coupled to the pMOS transistor source 625 through an MD layer interconnect 696 contacting the pMOS transistor source 625. The vias 662, 672 are aligned along the second direction orthogonal to the first direction, and the vias 663, 673 are aligned along the second direction orthogonal to the first direction. The nMOS active region 694 includes nMOS transistors 626 and 628 with nMOS transistor sources 627 and 629, respectively. A via 664 is coupled between the power rail 606 and the nMOS transistor source 627. A via 674 is coupled between the power rail 608 and the nMOS transistor source 627. A via 675 is coupled between the power rail 608 and the nMOS transistor source 629. A via 665 is coupled between the power rail 607 and the nMOS transistor source 629. The vias 664, 674 are coupled to the nMOS transistor source 627 through an MD layer interconnect 699 contacting the nMOS transistor source 627. The vias 665, 675 are coupled to the nMOS transistor source 629 through an MD layer interconnect 697 contacting the nMOS transistor source 629. The vias 664, 674 are aligned along the second direction orthogonal to the first direction, and the vias 675, 665 are aligned along the second direction orthogonal to the first direction.

As shown in FIG. 6, the vias 662, 672 are aligned along track 682 of available tracks 682, 684, and 686 extending in the second direction, and the vias 663, 673 are aligned along track 686 of available tracks 682, 684, and 686 extending in the second direction. In addition, the vias 664, 674 are aligned along track 682 of available tracks 682, 684, 686, and the vias 665, 675 are aligned along track 686 of available tracks 682, 684, 686. However, generally, the vias 662, 672 may align along a first track 682, 684, or 686 extending in the second direction, and the vias 664, 674 may align along a second track 682, 684, or 686 extending in the second direction. Specifically, the vias 662, 672 may align along the track corresponding to a source of at least one of the pMOS transistors 622, 624, and the vias 664, 674 may align along the track corresponding to a source of at least one of the nMOS transistors 626, 628. Further, generally, the vias 663, 673 may align along a first track 682, 684, or 686 extending in the second direction, and the vias 665, 675 may align along a second track 682, 684, or 686 extending in the second direction. Specifically, the vias 663, 673 may align along the track corresponding to a source of at least one of the pMOS transistors 622, 624, and the vias 665, 675 may align along the track corresponding to a source of at least one of the nMOS transistors 626, 628.

As shown in FIG. 6, the power rail 602 extends along the track 630 in the first direction, the power rail 604 extends along the track 634 in the first direction, and the power rail 603 extends along the track 636 in the first direction. In addition, the power rail 606 extends along the track 640 in the first direction, the power rail 608 extends along the track 644 in the first direction, and the power rail 607 extends along the track 646 in the first direction. The tracks 630, 636 have no intervening tracks between them. The tracks 630, 634 have one intervening track 632 between them. The tracks 640, 646 have no intervening tracks between them. The tracks 640, 644 have one intervening track 642 between them. The tracks 630, 632, 634, 636, 640, 642, 644, 646, 682, 684, 686 correspond to locations where interconnects, power rails, and vias may be routed/located.

The power rails 602, 604, 606, 608 may have approximately the same width $w_1$, and the power rails 603, 607 may have approximately the same width $w_2$. In one configuration, the width $w_2$ is less than the width $w_1$. For example, the width $w_1$ may be 24 nm and the width $w_2$ may be 20 nm. In one configuration, M1 interconnects that are not power rails and that extend on tracks between tracks 634 and 644 may have a different width (e.g., 22 nm) than the width of the first and second sets of power rails 602, 604, 606, 608. Further, M1 interconnects that are not power rails and that extend on tracks 632 and/or 642 may have the same width (e.g., 24 nm) as the first and second sets of power rails 602, 604, 606, 608.

Power rails in every other track may be formed by the same mask. As there is no intervening track between the power rails 603, 602 on tracks 636, 630, the power rails 603, 602 may be formed by different masks. In addition, as there is no intervening track between the power rails 607, 606 on tracks 646, 640, the power rails 607, 606 may be formed by different masks. Further, as there is just one intervening track 632 between the power rails 602, 604 on tracks 630, 634, and just one intervening track 642 between the power rails 606, 608 on tracks 640, 644, the power rails 602, 604 may be formed by the same mask, and the power rails 606, 608 may be formed by the same mask. If there are an even number of intervening tracks between the power rail 604 and the power rail 608, the power rails 604 and 608 may be formed by different masks. As such, the power rails 602, 604 may be formed by a different mask than the power rails 606, 608. However, if there are an odd number of intervening tracks between the power rail 604 and the power rail 608, the power rails 604 and 608 may be formed by the same mask. As such, the power rails 602, 604, 606, 608 may all be formed by the same mask. In one configuration, the MOS device includes an even number of tracks between the power rails 604, 608. In such a configuration, as shown in FIG. 6, the power rails 602, 604, 607 are formed by a first mask, and the power rails 603, 606, 608 are formed by a second mask different than the first mask. As discussed supra, balancing the formation of the power rails across different masks may improve manufacturing yield in relation to the power rails.

The fourth exemplary layout construction of FIG. 6 is similar to the first exemplary layout construction of FIG. 1, but includes shared power rails. In additional configurations, the second exemplary layout construction of FIG. 4 may include shared power rails, and the third exemplary layout construction of FIG. 5 may include shared power rails. When a layout construction includes a shared power rail, the vias connected to the shared power rail and the adjacent power rail may be horizontally offset from each other on different horizontal tracks, as shown in FIG. 6. For example, as shown in FIG. 6, the vias 662, 663 are offset from each other, as the via 662 is on horizontal track 630 and the via 663 is on horizontal track 636. For another example, the vias 664, 665 are offset from each other, as the via 664 is on horizontal track 640 and the via 665 is on horizontal track 646. Other associated vias may be horizontally aligned with each other. For example, as shown in FIG. 6, the vias 672, 673 are horizontally aligned on the same horizontal track 634, and the vias 674, 675 are horizontally aligned on the same horizontal track 644.

Figure 7:
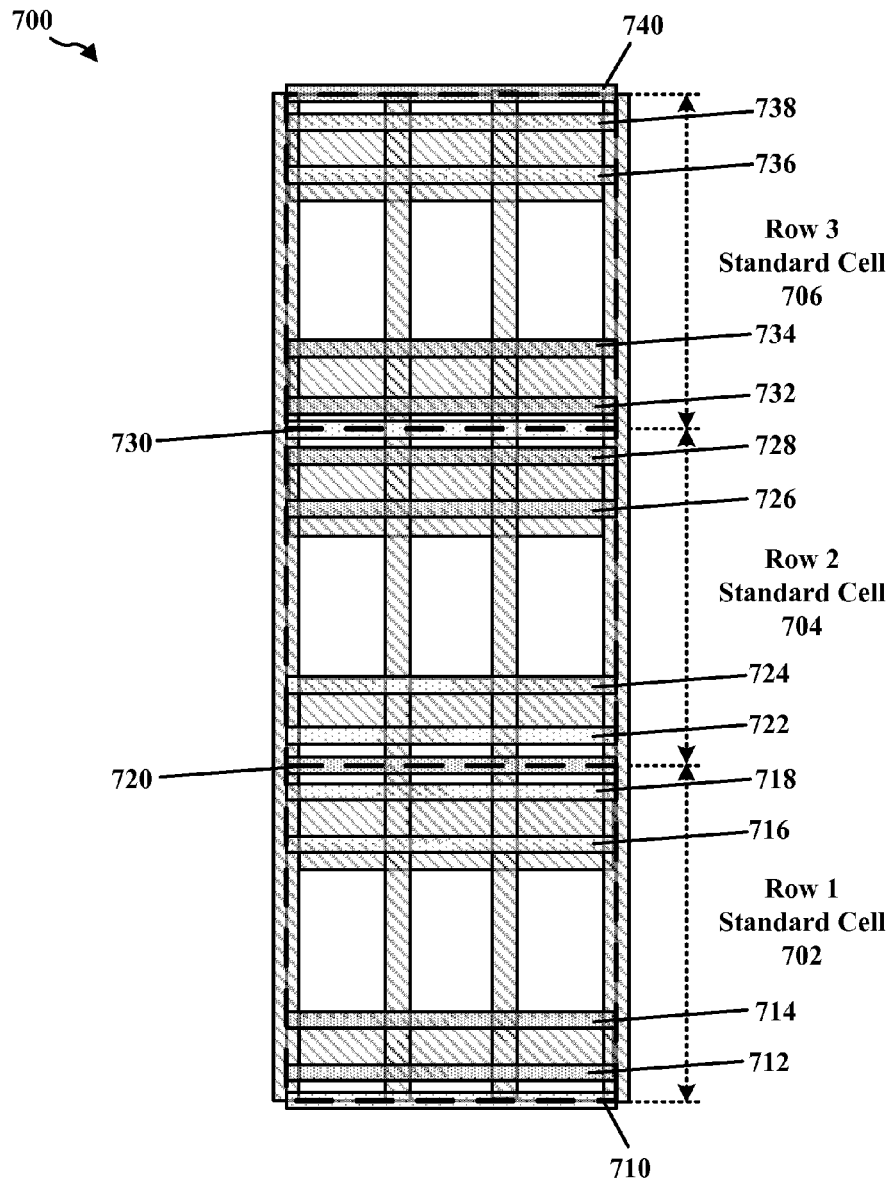
FIG. 7 is a diagram illustrating an exemplary set of stacked standard cells.

FIG. 7 is a diagram 700 illustrating an exemplary set of stacked standard cells. Each standard cell 702, 704, 706 has power rails as described with respect to the fourth exemplary layout construction of FIG. 6. The standard cells 702, 704, 706 are stacked in rows. The standard cell 702 includes nMOS power rails 710, 712, 714, and pMOS power rails 716, 718, 720. The nMOS power rail 710 and the pMOS power rail 720 are shared. The standard cell 704 includes pMOS power rails 720, 722, 724, and nMOS power rails 726, 728, 730. The pMOS power rail 720 and the nMOS power rail 730 are shared. The standard cell 706 includes nMOS power rails 730, 732, 734, and pMOS power rails 736, 738, 740. The nMOS power rail 730 and the pMOS power rail 740 are shared. The power rails 710, 716, 718, 722, 724, 730, 736, and 738 may be formed by a first mask, and the power rails 712, 714, 720, 726, 728, 732, 734, and 740 may be formed by a second mask different than the first mask.

Figures 8A, 8B:
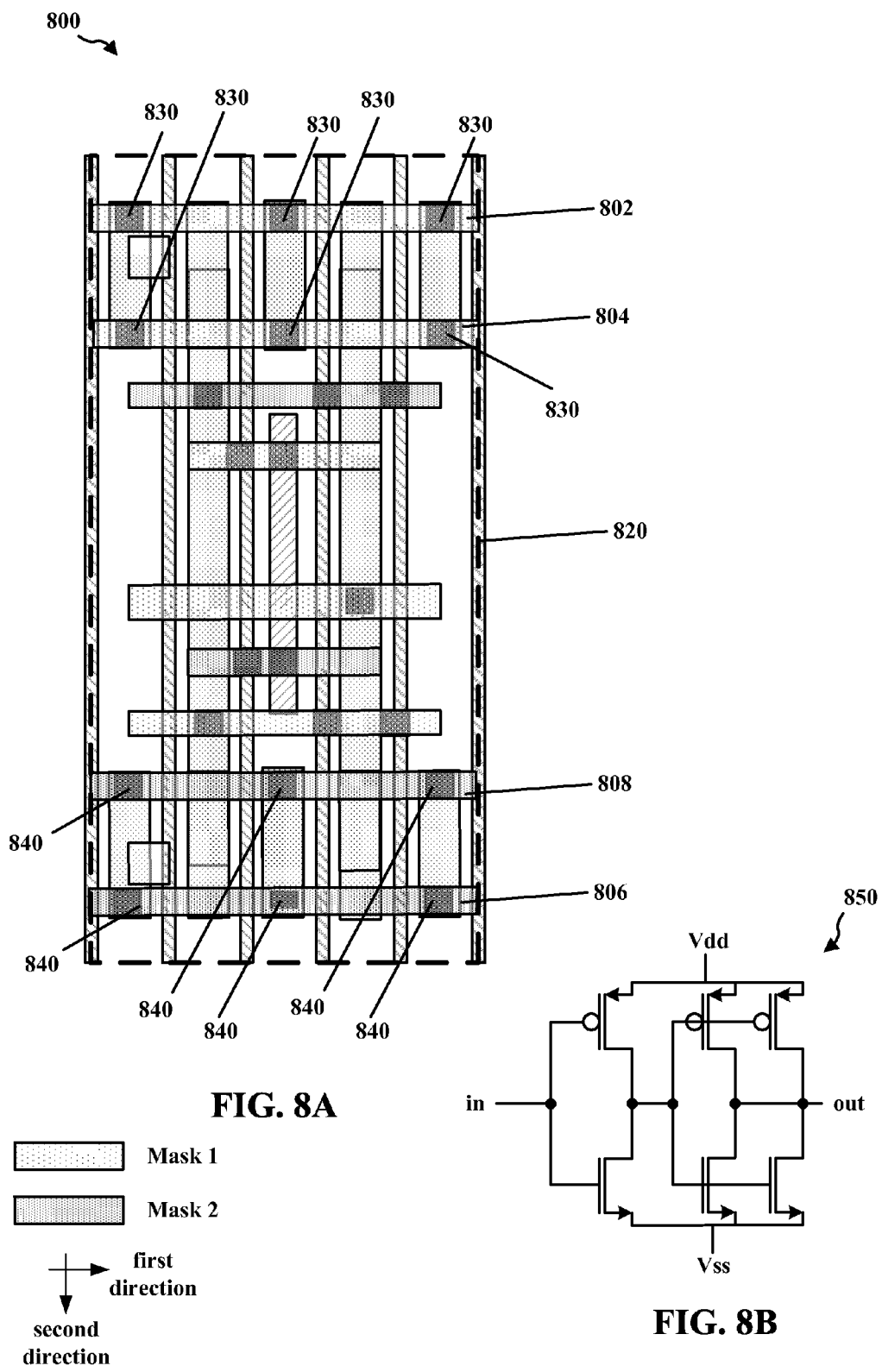
FIG. 8A is a diagram illustrating a buffer according to the first exemplary layout construction.
FIG. 8B is a circuit diagram of the buffer.

FIG. 8A is a diagram 800 illustrating a buffer according to the first exemplary layout construction. FIG. 8B is a circuit diagram 850 of the buffer. As shown in FIG. 8A, the buffer MOS device includes a first set of power rails 802, 804, and a second set of power rails 806, 808. The first set of power rails 802, 804 extends in a first direction across the MOS device. The first set of power rails 802, 804 includes at least two power rails for providing a first voltage VDD to the MOS device. The first set of power rails 802, 804 are connected to pMOS transistor sources of pMOS transistors through the vias 830 and MD layer interconnects that contact the pMOS transistor sources. The first set of power rails 802, 804 are connected together through the pMOS transistor source connections. The first set of power rails 802, 804 is interior to an edge of a cell boundary 820 in the MOS device with respect to a second direction orthogonal to the first direction. At least one power rail of the first set of power rails 802, 804 extends over a pMOS active region of the MOS device. In this example, each of the power rails of the first set of power rails 802, 804 extends over a pMOS active region of the MOS device. The second set of power rails 806, 808 extends in the first direction across the MOS device. The second set of power rails 806, 808 includes at least two power rails for providing a second voltage VSS to the MOS device. The second voltage VSS is different than the first voltage VDD. The second set of power rails 806, 808 are connected to nMOS transistor sources of nMOS transistors through the vias 840 and MD layer interconnects that contact the nMOS transistor sources. The second set of power rails 806, 808 are connected together through the nMOS transistor source connections. The second set of power rails 806, 808 is interior to an edge of a cell boundary 820 in the MOS device with respect to the second direction. At least one power rail of the second set of power rails extends over an nMOS active region of the MOS device. In this example, each of the power rails of the second set of power rails 806, 808 extends over an nMOS active region of the MOS device.

Figures 9A, 9B:
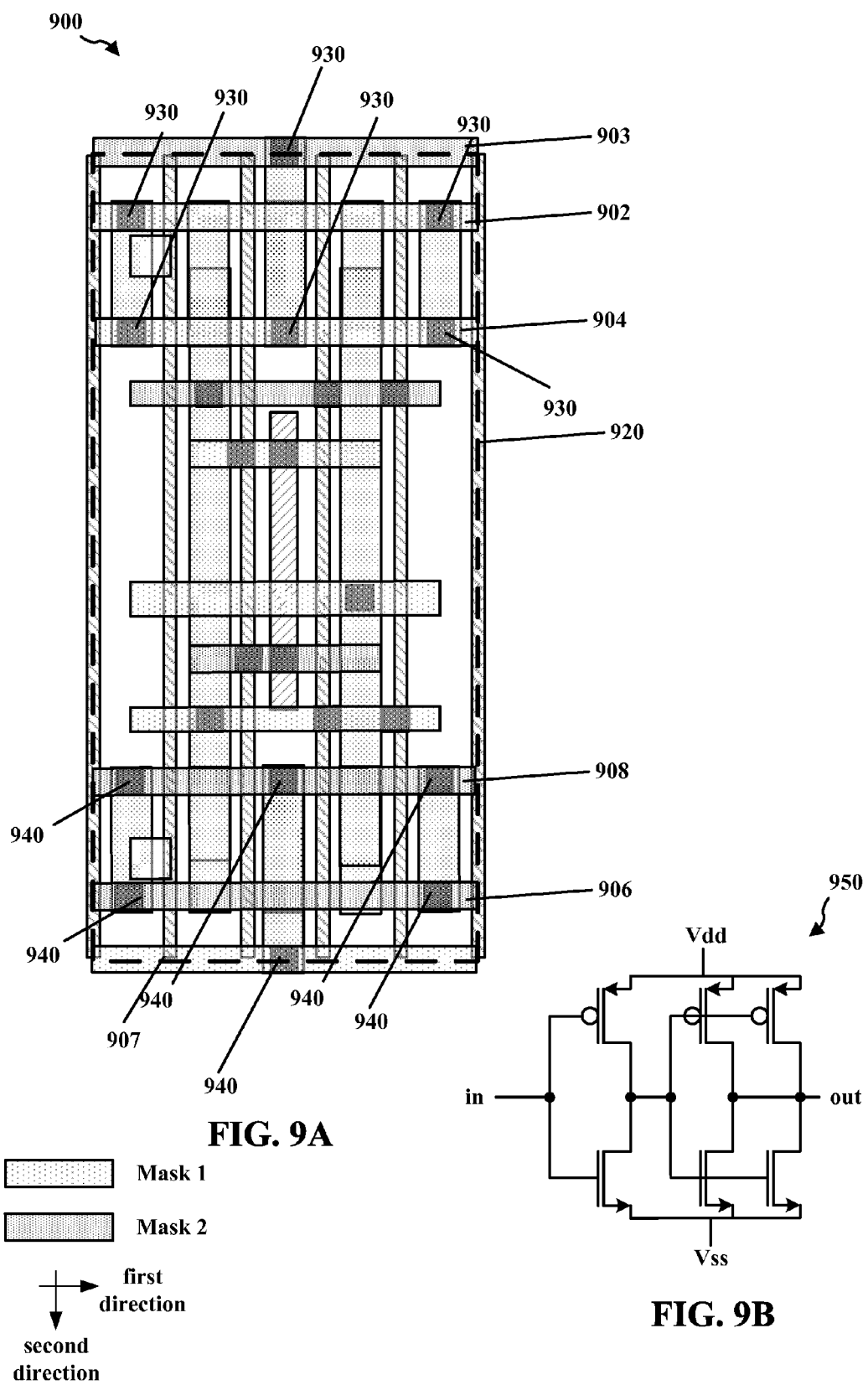
FIG. 9A is a diagram illustrating a buffer according to the fourth exemplary layout construction.
FIG. 9B is a circuit diagram of the buffer.

FIG. 9A is a diagram 900 illustrating a buffer according to the fourth exemplary layout construction. FIG. 9B is a circuit diagram 950 of the buffer. As shown in FIG. 9A, the buffer MOS device includes a first set of power rails 902, 904, and a second set of power rails 906, 908. The first set of power rails 902, 904 extends in a first direction across the MOS device. The first set of power rails 902, 904 includes at least two power rails for providing a first voltage VDD to the MOS device. The first set of power rails 902, 904 is interior to an edge of a cell boundary 920 in the MOS device with respect to a second direction orthogonal to the first direction. At least one power rail of the first set of power rails 902, 904 extends over a pMOS active region of the MOS device. In this example, each of the power rails of the first set of power rails 902, 904 extends over a pMOS active region of the MOS device. The second set of power rails 906, 908 extends in the first direction across the MOS device. The second set of power rails 906, 908 includes at least two power rails for providing a second voltage VSS to the MOS device. The second voltage VSS is different than the first voltage VDD. The second set of power rails 906, 908 is interior to an edge of a cell boundary 920 in the MOS device with respect to the second direction. At least one power rail of the second set of power rails extends over an nMOS active region of the MOS device. In this example, each of the power rails of the second set of power rails 906, 908 extends over an nMOS active region of the MOS device. The buffer MOS device further includes a shared pMOS power rail 903 extending across the MOS device at a first edge of the cell boundary 920 in the MOS device, and a shared nMOS power rail 907 extending across the MOS device at a second edge of the cell boundary 920 in the MOS device.

The first set of power rails 902, 904 and the shared pMOS power rail 903 are connected to pMOS transistor sources of pMOS transistors through the vias 930 and MD layer interconnects that contact the pMOS transistor sources. The first set of power rails 902, 904 and the shared pMOS power rail 903 are connected together through the pMOS transistor source connections. The second set of power rails 906, 908 and the shared nMOS power rail 907 are connected to nMOS transistor sources of nMOS transistors through the vias 940 and MD layer interconnects that contact the nMOS transistor sources. The second set of power rails 906, 908 and the shared nMOS power rail 907 are connected together through the nMOS transistor source connections.

The width of each of the shared power rails 903, 907 may be less than a width of each of the power rails of the first and second sets of power rails 902, 904, 906, 908. For example, the width of each of the shared power rails 903, 907 may be 20 nm, and the width of each of the power rails of the first and second sets of power rails 902, 904, 906, 908 may be 24 nm.

Referring again to FIGS. 3-6, a MOS device includes a first set of power rails (302, 304; 402, 404; 502, 503, 504; 602; 604) and a second set of power rails (306, 308; 406, 408; 506, 507, 508; 606, 608). The first set of power rails (302, 304; 402, 404; 502, 503, 504; 602; 604) extends in a first direction across the MOS device. The first set of power rails (302, 304; 402, 404; 502, 503, 504; 602; 604) includes at least two power rails for providing a first voltage VDD to the MOS device. The first set of power rails (302, 304; 402, 404; 502, 503, 504; 602; 604) is interior to an edge of a cell boundary (350; 450; 550; 650) in the MOS device with respect to a second direction orthogonal to the first direction. At least one power rail (302, 304; 402; 502, 504; 602; 604) of the first set of power rails (302, 304; 402, 404; 502, 503, 504; 602; 604) extends over a pMOS active region of the MOS device. The second set of power rails (306, 308; 406, 408; 506, 507, 508; 606, 608) extends in the first direction across the MOS device. The second set of power rails (306, 308; 406, 408; 506, 507, 508; 606, 608) includes at least two power rails for providing a second voltage VSS to the MOS device. The second voltage VSS is different than the first voltage VDD. The second set of power rails (306, 308; 406, 408; 506, 507, 508; 606, 608) is interior to an edge of the cell boundary (350; 450; 550; 650) in the MOS device with respect to the second direction. At least one power rail (306, 308; 406; 506, 508; 606, 608) of the second set of power rails (306, 308; 406, 408; 506, 507, 508; 606, 608) extends over an nMOS active region of the MOS device.

In one configuration, the first set of power rails (302, 304; 402, 404; 502, 503, 504; 602; 604) and the second set of power rails (306, 308; 406, 408; 506, 507, 508; 606, 608) are unidirectional M1 layer power rails. In one configuration, the pMOS active region (392; 492; 592) includes a pMOS transistor (322 or 324; 422 or 424; 522 or 524; 622) having a pMOS transistor source (323; 423; 523; 623). The first set of power rails (302, 304; 402, 404; 502, 503, 504; 602; 604) includes a first pMOS power rail (302; 402; 502; 602) and a second pMOS power rail (304; 404; 504; 604). The MOS device further includes a first via (362; 462; 562; 662) coupled between the first pMOS power rail (302; 402; 502; 602) and the pMOS transistor source (323; 423; 523; 623), and a second via (372; 472; 572; 672) coupled between the second pMOS power rail (304; 404; 504; 604) and the pMOS transistor source (323; 423; 523; 623). In one configuration, the first via (362; 462; 562; 662) and the second via (372; 472; 572; 672) are aligned along the second direction orthogonal to the first direction.

In one configuration, the nMOS active region (394; 494; 594; 694) includes an nMOS transistor (326 or 328; 426 or 428; 526 or 528; 626) having an nMOS transistor source (327; 427; 527; 627). The second set of power rails (306, 308; 406, 408; 506, 507, 508; 606, 608) includes a first nMOS power rail (306; 406; 506; 606) and a second nMOS power rail (308; 408; 508; 608). The MOS device further includes a third via (364; 464; 564; 664) coupled between the first nMOS power rail (306; 406; 506; 606) and the nMOS transistor source (327; 427; 527; 627), and a fourth via (374; 474; 574; 674) coupled between the second nMOS power rail (308; 408; 508; 608) and the nMOS transistor source (327; 427; 527; 627). In one configuration, the first via (362; 462; 562; 662) and the second via (372; 472; 572; 672) are aligned along a first track (384; 484; 584; 682) extending in the second direction orthogonal to the first direction, and the third via (364; 464; 564; 664) and the fourth via (374; 474; 574; 674) are aligned along a second track (384; 484; 584; 682) extending in the second direction. As shown in FIGS. 3-6, the first and second tracks are the same. However, in some configurations, the first and second tracks may be different.

In one configuration, at least two power rails (302, 304; 502, 504; 602; 604) of the first set of power rails (302, 304; 502, 503, 504; 602; 604) extend over the pMOS active region of the MOS device, and at least two power rails (306, 308; 506, 508; 606, 608) of the second set of power rails (306, 308; 506, 507, 508; 606, 608) extend over the nMOS active region of the MOS device. In one configuration, the first set of power rails (502, 503, 504) includes at least three power rails, and the second set of power rails (506, 507, 508) includes at least three power rails. At least one power rail (503) of the first set of power rails (502, 503, 504) extends over the MOS device in a region other than the pMOS active region (592) of the MOS device, and at least one power rail (507) of the second set of power rails (506, 507, 508) extends over the MOS device in a region other than the nMOS active region (594) of the MOS device. In one configuration, the first set of power rails (302, 304; 502, 503, 504; 602; 604) are formed by a first mask, and the second set of power rails (306, 308; 506, 507, 508; 606, 608) are formed by a second mask different than the first mask.

In one configuration, each of the power rails of the first set of power rails (302, 304; 602; 604) and the second set of power rails (306, 308; 606, 608) have approximately the same width (e.g., 24 nm). In one configuration, at least one power rail (402; 502, 504) of the first set of power rails (402, 404; 502, 503, 504) has a first width (e.g., 24 nm) and at least one power rail (404; 503) of the first set of power rails (402, 404; 502, 503, 504) has a second width (e.g., 22 nm), and at least one power rail (406; 506, 508) of the second set of power rails (406, 408; 506, 507, 508) has the first width and at least one power rail (408; 507) of the second set of power rails (406, 408; 506, 507, 508) has the second width. The second width is different than the first width. The second width may be less than the first width.

In one configuration, the first set of power rails (302, 304; 502, 503, 504; 602; 604) includes a first pMOS power rail (302; 502; 602) that extends along a first track (330; 530; 630) in the first direction and a second pMOS power rail (304; 504; 604) that extends along a second track (334; 534; 634) in the first direction, and the second set of power rails (306, 308; 506, 507, 508; 606, 608) includes a first nMOS power rail (306; 506; 606) that extends along a third track (340; 540; 640) in the first direction and a second nMOS power rail (308; 508; 608) that extends along a fourth track (344; 544; 644) in the first direction. The first track (330; 530; 630) and the second track (334; 534; 634) have one intervening track (332; 532; 632) therebetween. The third track (340; 540; 640) and the fourth track (344; 544; 644) have one intervening track (342; 542; 642) therebetween. In one configuration, the first set of power rails (502, 503, 504) includes a third pMOS power rail (503) that extends along a fifth track (538) in the first direction, and the second set of power rails (506, 507, 508) includes a third nMOS power rail (507) that extends along a sixth track (548) in the first direction. The second track (534) and the fifth track (538) have one intervening track (536) therebetween. The fourth track (544) and the sixth track (548) have one intervening track (546) therebetween.

In one configuration, at least one power rail (404; 503) of the first set of power rails (402, 404; 502, 503, 504) extends over the MOS device in a region other than the pMOS active region (492; 592) of the MOS device, and at least one power rail (408; 507) of the second set of power rails (406, 408; 506, 507, 508) extends over the MOS device in a region other than the nMOS active region (494; 594) of the MOS device.

In one configuration, the first set of power rails (402, 404) include a first pMOS power rail (402) and a second pMOS power rail (404), and the second set of power rails (406, 408) include a first nMOS power rail (406) and a second nMOS power rail (408). The first pMOS power rail (402) and the second nMOS power rail (408) are formed by a first mask, and the second pMOS power rail (404) and the first nMOS power rail (406) are formed by a second mask different than the first mask. In one configuration, the first pMOS power rail (402) and the first nMOS power rail (406) have approximately the same first width, and the second pMOS power rail (404) and the second nMOS power rail (408) have approximately the same second width different than the first width. In one configuration, the second width is less than the first width. For example, the first width may be 24 nm and the second width may be 22 nm.

In one configuration, the first set of power rails (402, 404) includes a first pMOS power rail (402) that extends along a first track (430) in the first direction and a second pMOS power rail (404) that extends along a second track (434) in the first direction, and the second set of power rails (406, 408) includes a first nMOS power rail (406) that extends along a third track (440) in the first direction and a second nMOS power rail (408) that extends along a fourth track (444) in the first direction. The first track (430) and the second track (434) have at least two intervening tracks (432, 436) therebetween, and the third track (440) and the fourth track (444) have at least two intervening tracks (442, 446) therebetween.

In one configuration, the MOS device further includes a shared pMOS power rail (603) extending across the MOS device at a first edge of the cell boundary (650) in the MOS device, and a shared nMOS power rail (607) extending across the MOS device at a second edge of the cell boundary (650) in the MOS device. In one configuration, the at least one power rail (602, 604) of the first set of power rails (602, 604) that extends over the pMOS active region (692) has a first width, the at least one power rail (606, 608) of the second set of power rails (606, 608) that extends over the nMOS active region (694) has the first width, and each of the shared pMOS power rail (603) and the shared nMOS power rail (607) have a second width different than the first width. In one configuration, the second width is less than the first width. For example, the second width may be 20 nm and the first width may be 24 nm. In one configuration, the pMOS active region 692 includes a first pMOS transistor 622 having a first pMOS transistor source 623, and a second pMOS transistor 624 having a second pMOS transistor source 625. The first set of power rails (602, 604) includes a first pMOS power rail (602) and a second pMOS power rail (604). The MOS device further includes a first via (662) coupled between the first pMOS power rail (602) and the first pMOS transistor source (623), a second via (672) coupled between the second pMOS power rail (604) and the first pMOS transistor source (623), a third via (663) coupled between the shared pMOS power rail (603) and the second pMOS transistor source (625), and a fourth via (673) coupled between the second pMOS power rail (604) and the second pMOS transistor source (625). In one configuration, the first via (662) and the second via (672) are aligned along a first track (682) extending in the second direction orthogonal to the first direction, and the third via (663) and the fourth via (673) are aligned along a second track (686) extending in the second direction. The second track (686) is different than the first track (682). In one configuration, the nMOS active region (694) includes a first nMOS transistor (626) having a first nMOS transistor source (627), and a second nMOS transistor (628) having a second nMOS transistor source (629). The second set of power rails (606, 608) includes a first nMOS power rail (606) and a second nMOS power rail (608). The MOS device further includes a fifth via (664) coupled between the first nMOS power rail (606) and the first nMOS transistor source (627), a sixth via (674) coupled between the second nMOS power rail (608) and the first nMOS transistor source (627), a seventh via (665) coupled between the shared nMOS power rail (607) and the second nMOS transistor source (629), and an eighth via (675) coupled between the second nMOS power rail (608) and the second nMOS transistor source (629). In one configuration, the first and second vias (662, 672) are aligned along a first track (682) extending in the second direction orthogonal to the first direction, and the third and fourth vias (663, 673) are aligned along a second track (686) extending in the second direction. The second track (686) is different than the first track (682). In addition, the fifth and sixth vias (664, 674) are aligned along a third track (682) extending in the second direction, and the seventh and eighth vias (665, 675) are aligned along a fourth track (686) extending in the second direction. The fourth track (686) is different than the third track (682). In one configuration, the first set of power rails (602, 604) and the shared nMOS power rail (607) are formed by a first mask, and the second set of power rails (606, 608) and the shared pMOS power rail (603) are formed by a second mask.

Figure 10:
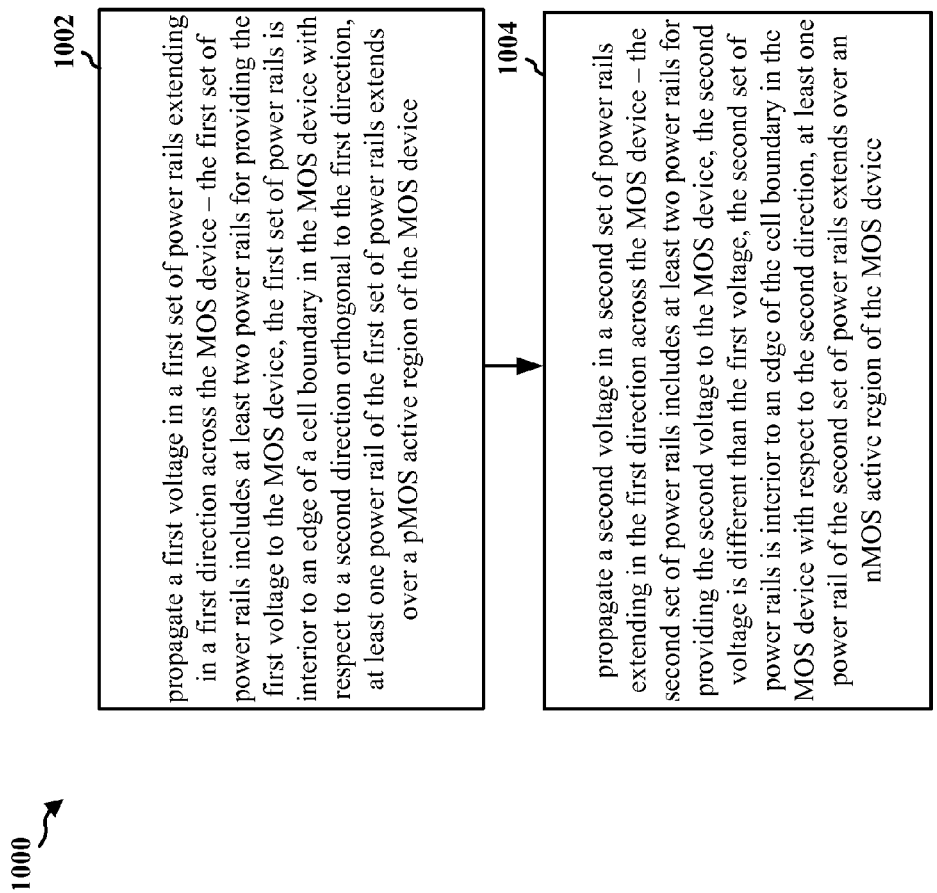
FIG. 10 is a flowchart of an exemplary method of a MOS device.

FIG. 10 is a flowchart 1000 of an exemplary method of a MOS device. At 1002, a first voltage VDD is propagated in a first set of power rails (302, 304; 402, 404; 502, 503, 504; 602; 604) extending in a first direction across the MOS device. The first set of power rails (302, 304; 402, 404; 502, 503, 504; 602; 604) includes at least two power rails for providing the first voltage VDD to the MOS device. The first set of power rails (302, 304; 402, 404; 502, 503, 504; 602; 604) is interior to an edge of a cell boundary (350; 450; 550; 650) in the MOS device with respect to a second direction orthogonal to the first direction. At least one power rail of the first set of power rails (302, 304; 402, 404; 502, 503, 504; 602; 604) extends over a pMOS active region (392; 492; 592; 692) of the MOS device. At 1004, a second voltage VSS is propagated in a second set of power rails (306, 308; 406, 408; 506, 507, 508; 606, 608) extending in the first direction across the MOS device. The second set of power rails (306, 308; 406, 408; 506, 507, 508; 606, 608) includes at least two power rails for providing the second voltage VSS to the MOS device. The second voltage VSS is different than the first voltage VDD. The second set of power rails (306, 308; 406, 408; 506, 507, 508; 606, 608) is interior to an edge of the cell boundary (350; 450; 550; 650) in the MOS device with respect to the second direction. At least one power rail of the second set of power rails (306, 308; 406, 408; 506, 507, 508; 606, 608) extends over an nMOS active region (394; 494; 594; 694) of the MOS device.

In one configuration, a MOS device includes means for propagating a first voltage VDD in a first set of power rails (302, 304; 402, 404; 502, 503, 504; 602; 604) extending in a first direction across the MOS device. The means for propagating the first voltage VDD in the first set of power rails (302, 304; 402, 404; 502, 503, 504; 602; 604) is the first set of power rails (302, 304; 402, 404; 502, 503, 504; 602; 604). The first set of power rails (302, 304; 402, 404; 502, 503, 504; 602; 604) includes at least two power rails for providing the first voltage VDD to the MOS device. The first set of power rails (302, 304; 402, 404; 502, 503, 504; 602; 604) is interior to an edge of a cell boundary (350; 450; 550; 650) in the MOS device with respect to a second direction orthogonal to the first direction. At least one power rail of the first set of power rails (302, 304; 402, 404; 502, 503, 504; 602; 604) extends over a pMOS active region (392; 492; 592; 692) of the MOS device. The MOS device further includes means for propagating a second voltage VSS in a second set of power rails (306, 308; 406, 408; 506, 507, 508; 606, 608) extending in the first direction across the MOS device. The means for propagating the second voltage VSS in the second set of power rails (306, 308; 406, 408; 506, 507, 508; 606, 608) is the set of power rails (306, 308; 406, 408; 506, 507, 508; 606, 608). The second set of power rails (306, 308; 406, 408; 506, 507, 508; 606, 608) includes at least two power rails for providing the second voltage VSS to the MOS device. The second voltage VSS is different than the first voltage VDD. The second set of power rails (306, 308; 406, 408; 506, 507, 508; 606, 608) is interior to an edge of the cell boundary (350; 450; 550; 650) in the MOS device with respect to the second direction. At least one power rail of the second set of power rails (306, 308; 406, 408; 506, 507, 508; 606, 608) extends over an nMOS active region (394; 494; 594; 694) of the MOS device.

As provided supra, exemplary multiple split power rail standard cell library architectures are provided. An exemplary multiple split power rail standard cell library architecture may be utilized when shared power rails are unavailable or are available in widths that are insufficient to support IR-drop/EM requirements.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. The term "connected" means "directly connected." The term "coupled" means "connected" or "indirectly connected" through other elements. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A metal oxide semiconductor (MOS) device, comprising:
a first set of power rails extending in a first direction across the MOS device, the first set of power rails including at least two power rails for providing a first voltage to the MOS device, the first set of power rails being interior to an edge of a cell boundary in the MOS device with respect to a second direction orthogonal to the first direction, at least one power rail of the first set of power rails extending over a p-type MOS (pMOS) active region of the MOS device; and
a second set of power rails extending in the first direction across the MOS device, the second set of power rails including at least two power rails for providing a second voltage to the MOS device, the second voltage being different than the first voltage, the second set of power rails being interior to an edge of the cell boundary in the MOS device with respect to the second direction, at least one power rail of the second set of power rails extending over an n-type MOS (nMOS) active region of the MOS device.

2. The MOS device of claim 1, wherein the first set of power rails are connected to a same pMOS transistor source in the pMOS active region, and the second set of power rails are connected to a same nMOS transistor source in the nMOS active region.

3. The MOS device of claim 1, wherein the first and second sets of power rails are unidirectional metal one (M1) layer power rails.

4. The MOS device of claim 1, wherein the pMOS active region includes a pMOS transistor having a pMOS transistor source, the first set of power rails includes a first pMOS power rail and a second pMOS power rail, and the MOS device further comprises:
a first via coupled between the first pMOS power rail and the pMOS transistor source; and
a second via coupled between the second pMOS power rail and the pMOS transistor source.

5. The MOS device of claim 4, wherein the first and second vias are aligned along the second direction orthogonal to the first direction.

6. The MOS device of claim 4, wherein the nMOS active region includes an nMOS transistor having an nMOS transistor source, the second set of power rails includes a first nMOS power rail and a second nMOS power rail, and the MOS device further comprises:
a third via coupled between the first nMOS power rail and the nMOS transistor source; and
a fourth via coupled between the second nMOS power rail and the nMOS transistor source.

7. The MOS device of claim 6, wherein the first and second vias are aligned along a first track extending in the second direction orthogonal to the first direction, and the third and fourth vias are aligned along a second track extending in the second direction.

8. The MOS device of claim 1, wherein at least two power rails of the first set of power rails extend over the pMOS active region of the MOS device, and at least two power rails of the second set of power rails extend over the nMOS active region of the MOS device.

9. The MOS device of claim 8, wherein the first set of power rails comprises at least three power rails, the second set of power rails comprises at least three power rails, at least one power rail of the first set of power rails extends over the MOS device in a region other than the pMOS active region of the MOS device, and at least one power rail of the second set of power rails extends over the MOS device in a region other than the nMOS active region of the MOS device.

10. The MOS device of claim 1, wherein the first set of power rails are formed by a first mask, and the second set of power rails are formed by a second mask different than the first mask.

11. The MOS device of claim 1, wherein each of the power rails of the first and second sets of power rails have approximately a same width.

12. The MOS device of claim 1, wherein at least one power rail of the first set of power rails has a first width and at least one power rail of the first set of power rails has a second width, and at least one power rail of the second set of power rails has the first width and at least one power rail of the second set of power rails has the second width, the second width being different than the first width.

13. The MOS device of claim 12, wherein the second width is less than the first width.

14. The MOS device of claim 1, wherein the first set of power rails includes a first pMOS power rail that extends along a first track in the first direction and a second pMOS power rail that extends along a second track in the first direction, and the second set of power rails includes a first nMOS power rail that extends along a third track in the first direction and a second nMOS power rail that extends along a fourth track in the first direction, the first track and the second track having one intervening track therebetween, the third track and the fourth track having one intervening track therebetween.

15. The MOS device of claim 14, wherein the first set of power rails includes a third pMOS power rail that extends along a fifth track in the first direction, and the second set of power rails includes a third nMOS power rail that extends along a sixth track in the first direction, the second track and the fifth track having one intervening track therebetween, the fourth track and the sixth track having one intervening track therebetween.

16. The MOS device of claim 1, wherein at least one power rail of the first set of power rails extends over the MOS device in a region other than the pMOS active region of the MOS device, and at least one power rail of the second set of power rails extends over the MOS device in a region other than the nMOS active region of the MOS device.

17. The MOS device of claim 1, wherein the first set of power rails include a first pMOS power rail and a second pMOS power rail, and the second set of power rails include a first nMOS power rail and a second nMOS power rail, wherein the first pMOS power rail and the second nMOS power rail are formed by a first mask, and the second pMOS power rail and the first nMOS power rail are formed by a second mask different than the first mask.

18. The MOS device of claim 17, wherein the first pMOS power rail and the first nMOS power rail have approximately a same first width, and the second pMOS power rail and the second nMOS power rail have approximately a same second width different than the first width.

19. The MOS device of claim 18, wherein the second width is less than the first width.

20. The MOS device of claim 1, wherein the first set of power rails includes a first pMOS power rail that extends along a first track in the first direction and a second pMOS power rail that extends along a second track in the first direction, and the second set of power rails includes a first nMOS power rail that extends along a third track in the first direction and a second nMOS power rail that extends along a fourth track in the first direction, the first track and the second track having at least two intervening tracks therebetween, the third track and the fourth track having at least two intervening tracks therebetween.

21. The MOS device of claim 1, further comprising:
a shared pMOS power rail extending across the MOS device at a first edge of the cell boundary in the MOS device; and
a shared nMOS power rail extending across the MOS device at a second edge of the cell boundary in the MOS device.

22. The MOS device of claim 21, wherein said at least one power rail of the first set of power rails that extends over the pMOS active region has a first width, said at least one power rail of the second set of power rails that extends over the nMOS active region has the first width, and each of the shared pMOS power rail and the shared nMOS power rail have a second width different than the first width.

23. The MOS device of claim 21, wherein the pMOS active region includes a first pMOS transistor having a first pMOS transistor source, and a second pMOS transistor having a second pMOS transistor source, the first set of power rails includes a first pMOS power rail and a second pMOS power rail, and the MOS device further comprises:
a first via coupled between the first pMOS power rail and the first pMOS transistor source;
a second via coupled between the second pMOS power rail and the first pMOS transistor source;
a third via coupled between the shared pMOS power rail and the second pMOS transistor source; and
a fourth via coupled between the second pMOS power rail and the second pMOS transistor source.

24. The MOS device of claim 23, wherein the first and second vias are aligned along a first track extending in the second direction orthogonal to the first direction, and the third and fourth vias are aligned along a second track extending in the second direction, the second track being different than the first track.

25. The MOS device of claim 23, wherein the nMOS active region includes a first nMOS transistor having a first nMOS transistor source, and a second nMOS transistor having a second nMOS transistor source, the second set of power rails includes a first nMOS power rail and a second nMOS power rail, and the MOS device further comprises:
a fifth via coupled between the first nMOS power rail and the first nMOS transistor source;
a sixth via coupled between the second nMOS power rail and the first nMOS transistor source;
a seventh via coupled between the shared nMOS power rail and the second nMOS transistor source; and
an eighth via coupled between the second nMOS power rail and the second nMOS transistor source.

26. The MOS device of claim 25, wherein:
the first and second vias are aligned along a first track extending in the second direction orthogonal to the first direction;
the third and fourth vias are aligned along a second track extending in the second direction, the second track being different than the first track;
the fifth and sixth vias are aligned along a third track extending in the second direction; and
the seventh and eighth vias are aligned along a fourth track extending in the second direction, the fourth track being different than the third track.

27. The MOS device of claim 21, wherein the first set of power rails and the shared nMOS power rail are formed by a first mask, and the second set of power rails and the shared pMOS power rail are formed by a second mask.

28. A method of operation of a metal oxide semiconductor (MOS) device, comprising:
propagating a first voltage in a first set of power rails extending in a first direction across the MOS device, the first set of power rails including at least two power rails for providing the first voltage to the MOS device, the first set of power rails being interior to an edge of a cell boundary in the MOS device with respect to a second direction orthogonal to the first direction, at least one power rail of the first set of power rails extending over a p-type MOS (pMOS) active region of the MOS device; and
propagating a second voltage in a second set of power rails extending in the first direction across the MOS device, the second set of power rails including at least two power rails for providing the second voltage to the MOS device, the second voltage being different than the first voltage, the second set of power rails being interior to an edge of the cell boundary in the MOS device with respect to the second direction, at least one power rail of the second set of power rails extending over an n-type MOS (nMOS) active region of the MOS device.

29. A metal oxide semiconductor (MOS) device, comprising:
means for propagating a first voltage in a first set of power rails extending in a first direction across the MOS device, the first set of power rails including at least two power rails for providing the first voltage to the MOS device, the first set of power rails being interior to an edge of a cell boundary in the MOS device with respect to a second direction orthogonal to the first direction, at least one power rail of the first set of power rails extending over a p-type MOS (pMOS) active region of the MOS device; and
means for propagating a second voltage in a second set of power rails extending in the first direction across the MOS device, the second set of power rails including at least two power rails for providing the second voltage to the MOS device, the second voltage being different than the first voltage, the second set of power rails being interior to an edge of the cell boundary in the MOS device with respect to the second direction, at least one power rail of the second set of power rails extending over an n-type MOS (nMOS) active region of the MOS device.

30. A computer-readable medium comprising design data corresponding to an apparatus, the apparatus comprising:
    a first set of power rails extending in a first direction across the MOS device, the first set of power rails including at least two power rails for providing a first voltage to the MOS device, the first set of power rails being interior to an edge of a cell boundary in the MOS device with respect to a second direction orthogonal to the first direction, at least one power rail of the first set of power rails extending over a p-type MOS (pMOS) active region of the MOS device; and
    a second set of power rails extending in the first direction across the MOS device, the second set of power rails including at least two power rails for providing a second voltage to the MOS device, the second voltage being different than the first voltage, the second set of power rails being interior to an edge of the cell boundary in the MOS device with respect to the second direction, at least one power rail of the second set of power rails extending over an n-type MOS (nMOS) active region of the MOS device.

* * * * *